United States Patent
Nara

(10) Patent No.: US 12,550,462 B2
(45) Date of Patent: Feb. 10, 2026

(54) IMAGING DEVICE

(71) Applicant: Tianma Japan, Ltd., Kanagawa (JP)

(72) Inventor: Shuhei Nara, Kanagawa (JP)

(73) Assignee: TIANMA JAPAN, LTD., Kawasaki (JP)

( * ) Notice: Subject to any disclaimer, the term of this patent is extended or adjusted under 35 U.S.C. 154(b) by 300 days.

(21) Appl. No.: 18/490,259

(22) Filed: Oct. 19, 2023

(65) Prior Publication Data

US 2024/0136373 A1 Apr. 25, 2024
US 2024/0234451 A9 Jul. 11, 2024

(30) Foreign Application Priority Data

Oct. 20, 2022 (JP) ................ 2022-168241

(51) Int. Cl.
| | |
|---|---|
| *H10F 39/00* | (2025.01) |
| *G01T 1/20* | (2006.01) |
| *H10F 39/18* | (2025.01) |

(52) U.S. Cl.
CPC ....... *H10F 39/8033* (2025.01); *G01T 1/2018* (2013.01); *H10F 39/014* (2025.01); *H10F 39/016* (2025.01); *H10F 39/1898* (2025.01); *H10F 39/80377* (2025.01); *H10F 39/811* (2025.01)

(58) Field of Classification Search
None
See application file for complete search history.

(56) References Cited

U.S. PATENT DOCUMENTS

| | | | |
|---|---|---|---|
| 9,236,518 B2* | 1/2016 | Yan | H10F 39/026 |
| 11,024,665 B2* | 6/2021 | Sakaida | H10F 39/028 |
| 2018/0076240 A1* | 3/2018 | Takechi | H10D 86/60 |
| 2019/0296049 A1* | 9/2019 | Zhuang | H10D 30/0321 |
| 2021/0199619 A1* | 7/2021 | Sekine | G01N 27/414 |

* cited by examiner

*Primary Examiner* — Edwin C Gunberg
(74) *Attorney, Agent, or Firm* — NIXON & VANDERHYE

(57) ABSTRACT

An imaging device includes a substrate, photodiode semiconductor layers on the substrate, an upper electrode and a lower electrode sandwiching the photodiode semiconductor layers, and a non-light-transmissive line included in a layer upper than the upper electrode, defining the substrate as the lowermost layer. The photodiode semiconductor layers include a first semiconductor layer, and a second semiconductor layer located between the first semiconductor layer and the lower electrode. The photodiode semiconductor layers have a groove in which the first semiconductor layer is removed in a region covered with the non-light-transmissive line in a planar view. A region overlapping the groove in the planar view does not include the upper electrode. The region overlapping the groove in the planar view includes a part of the second semiconductor layer and a part of the lower electrode.

12 Claims, 21 Drawing Sheets

IMAGING DEVICE

CROSS-REFERENCE TO RELATED APPLICATIONS

This non-provisional application claims priority under 35 U.S.C. § 119(a) on Patent Application No. 2022-168241 filed in Japan on Oct. 20, 2022, the entire content of which is hereby incorporated by reference.

BACKGROUND

This disclosure relates to an imaging device.

An imaging element including a p-n or p-i-n junction photodiode effectively produces drift of the electric charges generated from incident light when the photodiode is kept in a reverse-biased state such that a negative voltage is applied to the p-side and a positive voltage is applied to the n-side. The drifting charges are read as an electric signal by a detector circuit. Such imaging elements arrayed in one dimension or two dimensions can be utilized as an imaging device that outputs an image from light signals.

This imaging device is used as a flat panel detector (FPD) for an X-ray sensor, for example. The FPDs used for X-ray sensors are generally categorized as a direct conversion type and an indirect conversion type. The direct conversion type of FPDs include photoelectric conversion devices that directly convert X-rays to an electric signal with amorphous selenium or CdTe. The indirect conversion type of FPDs include a luminescent material (scintillator) that converts X-rays into light (such as visible light or ultraviolet light) and a photodiode array that converts the light into an electric signal in their X-ray detection panels.

SUMMARY

An imaging device according to an aspect of this disclosure includes a substrate, photodiode semiconductor layers on the substrate, an upper electrode and a lower electrode sandwiching the photodiode semiconductor layers, and a non-light-transmissive line included in a layer upper than the upper electrode, defining the substrate as the lowermost layer. The photodiode semiconductor layers include a first semiconductor layer, and a second semiconductor layer located between the first semiconductor layer and the lower electrode. The photodiode semiconductor layers have a groove in which the first semiconductor layer is removed in a region covered with the non-light-transmissive line in a planar view. A region overlapping the groove in the planar view does not include the upper electrode. The region overlapping the groove in the planar view includes a part of the second semiconductor layer and a part of the lower electrode.

It is to be understood that both the foregoing general description and the following detailed description are exemplary and explanatory and are not restrictive of this disclosure.

EMBODIMENTS

Figure 1:
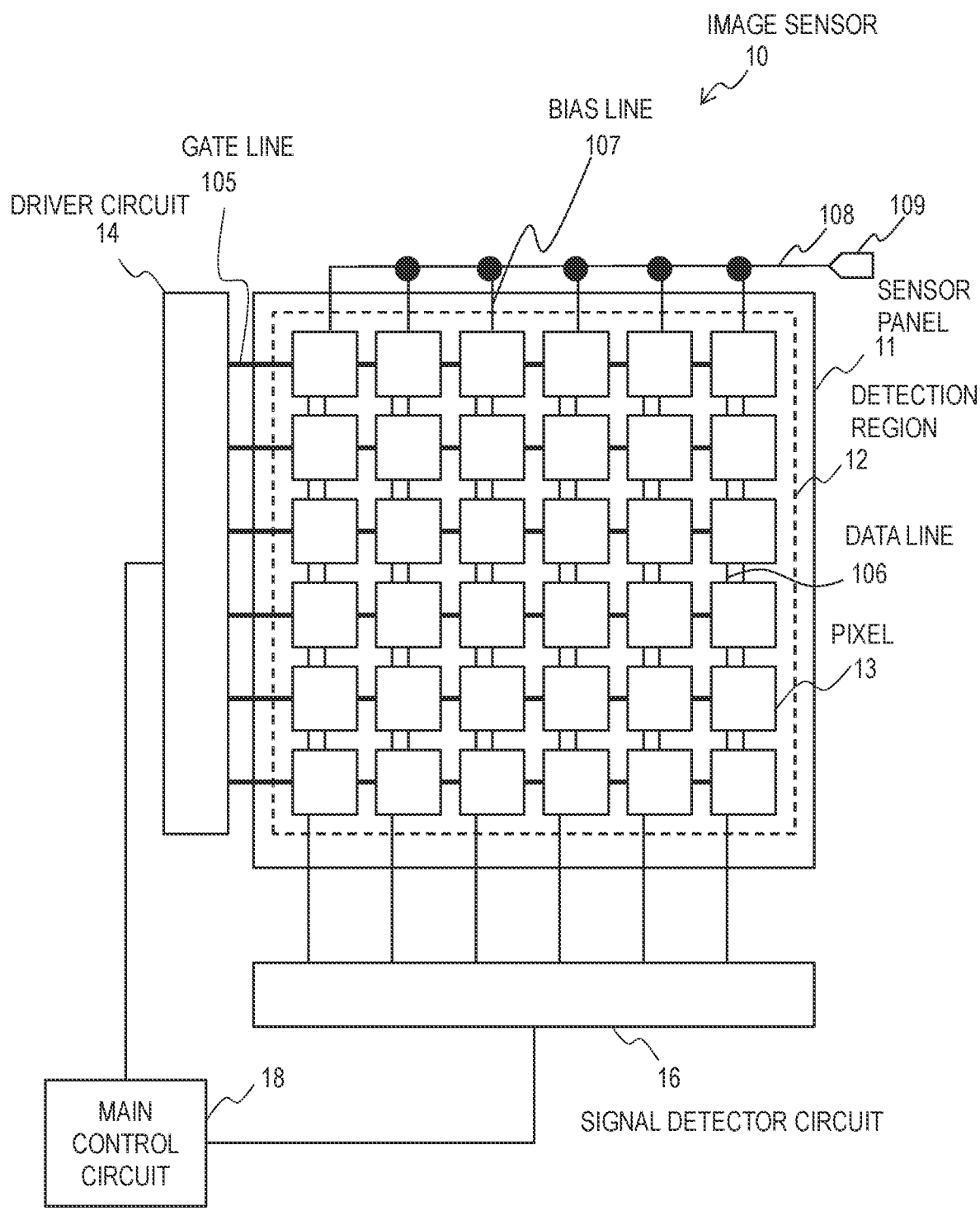
FIG. 1 is a block diagram illustrating a configuration of an image sensor in an embodiment.

Hereinafter, embodiments of this disclosure will be described specifically with reference to the drawings. The elements in the drawings are changed in size or scale as appropriate to be well recognized in the drawings. The hatches in the drawings are to distinguish the elements and are not necessarily to represent cross-sections. The non-linear elements used as switching elements or amplifying elements are referred to as transistors. The transistors include thin-film transistors (TFTs).

An embodiment in this specification is an imaging element. The imaging element of this disclosure is applicable to imaging devices such as radiographic imaging devices in the fields of medical and industrial non-destructive testing. The light to be detected by the imaging element is electromagnetic rays having a specific frequency, which can be infrared rays, visible light, or X-rays.

In general, an imaging element including a p-n or p-i-n junction photodiode effectively produces drift of the electric charges generated from incoming light when the photodiode is kept in a reverse-biased state such that a negative voltage is applied to the p-side and a positive voltage is applied to the n-side. To keep the reverse-biased state, the p-side and the n-side need to receive different potentials, they individually need electrodes or lines.

Either the p-side or the n-side of a photodiode works as a window layer to receive light. If it is covered with a line layer, the photodiode region is shaded and therefore, the covered region does not contribute to photoelectric conversion even when the photodiode is reverse-biased.

Signal-to-noise (S/N) ratio is used as an indicator of the sensitivity of an imaging element. To attain a high S/N ratio, increasing the sensitivity and/or reducing the noise are required. Between the p-layer and the n-layer, a junction capacitor whose capacitance depends on its area exists. When the photodiode is kept in a reverse-biased state, kTC noise proportional to the capacitance is generated and impairs the image quality. The junction capacitance and the kTC noise are independent from whether the capacitor is covered with a line layer. Accordingly, the region covered with a line layer involves adverse effect of the noise more than advantageous effect of an imaging element, compared to the other region.

An embodiment of this specification partially etches and removes the upper impurity-doped semiconductor layer (for example, a p-aSi layer) in the p-n or p-i-n semiconductor layers of a photodiode in the region covered with a line to cancel the junction there. The kTC noise decreases in proportion to the area of the region where the junction is canceled, raising the image quality. Furthermore, this configuration prevents disconnection of a line layer that crosses the photodiode semiconductor layers, raising the yield.

The kTC noise is proportional to the capacitance of the pixel, most of which is the junction capacitance of the photodiode. Since the junction capacitance is proportional to the area of the region where the p-layer and the n-layer are opposed to each other, removing the layer located upper by etching reduces the junction capacitance and as a result, the kTC noise also decreases.

The electric field generated by the p-layer and the n-layer opposed to each other drifts the charges generated by light. Accordingly, etching the light-receiving region impairs the original effect of the imaging element. For this reason, the junction in the shaded region covered with a line is canceled to suppress the reduction in photoelectric conversion efficiency.

The layers of a photodiode are usually formed thick for effective light absorption but they make a large difference in height for a line to be provided upper than the photodiode. Accordingly, disconnection of the line occurs frequently. Partially removing only the upper photodiode semiconductor layer provides a step for the line and moderates the height difference. Accordingly, the coatability in the region having the height difference improves and the frequency of disconnection decreases.

The typical material for the photodiode semiconductor layers is amorphous silicon. The features of the embodiments of this disclosure are applicable to photodiodes employing semiconductor materials different from amorphous silicon.

Although this specification describes photodiode semiconductor layers consisting of p-n or p-i-n layers as embodiments, the features of the embodiments are applicable to Schottky photodiode semiconductor layers that can be expressed as p-i or i-n layers or avalanche photodiode semiconductor layers produced by layering four or more layers selected from p, i, and n layers.

Embodiment 1

Configuration of Image Sensor

FIG. 1 is a block diagram illustrating a configuration example of an image sensor, which is an imaging device in an embodiment of this specification. The image sensor 10 includes a sensor panel 11 and control circuits. The control circuits include a driver circuit 14, a signal detector circuit 16, and a main control circuit 18.

The sensor panel 11 includes an insulating substrate (such as a glass substrate) and a detection region 12 on the insulating substrate. In the detection region 12, pixels 13 are arrayed horizontally and vertically like a matrix. A pixel 13 is an elemental device on the substrate that includes a photodiode of a photodetector. The layout of the pixels 13 is not limited to the matrix layout illustrated in FIG. 1 but can be a line layout consisting of a line of pixels 13. In the case of an X-ray image sensor, the detection region 12 includes scintillator that emits fluorescence in response to radial rays to be detected.

The pixels 13 are disposed at intersections between a plurality of data lines 106 and a plurality of gate lines (scanning lines) 105. In FIG. 1, the data lines 106 are disposed to extend vertically and be horizontally distant from one another. The gate lines 105 are disposed to extend horizontally and be vertically distant from one another. Each pixel 13 is connected to a bias line 107. In FIG. 1, bias lines are disposed to extend vertically and be horizontally distant from one another. In FIG. 1, only one of the pixels, one of the data lines, one of the gate lines, and one of the bias lines are provided with reference signs 13, 106, 105, and 107, respectively.

Each data line 106 is connected to a different pixel column. Each gate line 105 is connected to a different pixel row. The data line 106 is connected to the signal detector circuit 16 and the gate line 105 is connected to the driver circuit 14. Each bias line 107 is connected to a common bias line 108. A pad 109 of the common bias line 108 is supplied with a bias potential. The driver circuit 14 drives the gate lines 105 of the pixels 13 to detect light with the pixels 13. The signal detector circuit 16 detects signals from individual data lines. The main control circuit 18 controls the driver circuit 14 and the signal detector circuit 16.

Circuit Configuration of Pixel

Figure 2:
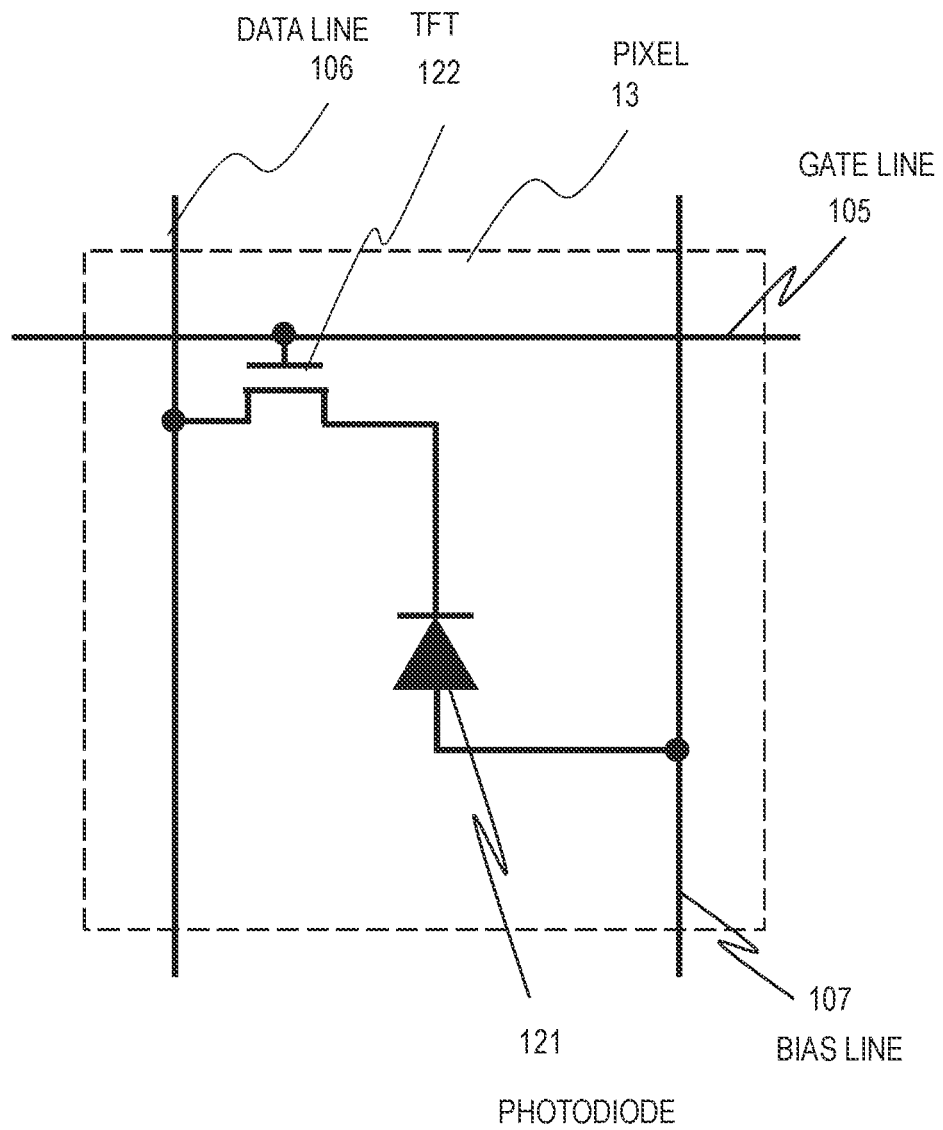
FIG. 2 is a circuit diagram of an equivalent circuit of a pixel of the image sensor in an embodiment.

FIG. 2 is a circuit diagram of an equivalent circuit of one pixel 13. The pixel 13 includes a photodiode 121 as a photoelectric conversion element and a thin-film transistor (TFT) 122 as a switching element. The gate terminal of the thin-film transistor 122 is connected to a gate line 105; the drain terminal is connected to a data line 106; and the source terminal is connected to the cathode terminal of the photodiode 121. In the example of FIG. 2, the anode terminal of the photodiode 121 is connected to a bias line 107.

The thin-film transistor 122 can be an oxide semiconductor thin-film transistor. Examples of the oxide semiconductor include InGaZnO (IGZO) and ZnO. The thin-film transistor 122 in an embodiment of this specification is of an n-conductive type.

The pixel 13 further includes a not-shown junction capacitor of the photodiode 121. From the viewpoint of the circuitry, the junction capacitor is connected to the thin-film transistor 122 and the bias line 107 in parallel to the photodiode 121. The image sensor 10 used as an X-ray imaging device stores signal charge in the amount corresponding to the amount of light incident on a photodiode 121 to the capacitive component of the pixel 13.

The main control circuit 18 reads the signal by making the thin-film transistor 122 in the pixel 13 conductive and taking out the charge stored in the capacitive component of the pixel 13 to the external. Specifically, the driver circuit 14 selects the gate lines 105 one by one and applies a pulse to turn the thin-film transistor 122 into a conductive state. The anode terminal of the photodiode 121 is connected to a bias line 107 and the data line 106 is supplied with a reference potential by the signal detector circuit 16. Accordingly, the photodiode 121 is charged to the difference voltage between the bias potential of the bias line 107 and the reference potential. This difference voltage is usually determined so that the cathode potential is higher than the anode potential to reverse-bias the photodiode 121.

The charge required to recharge the photodiode 121 to the reverse-bias voltage depends on the amount of light incident on the photodiode 121. The signal detector circuit 16 reads the signal charge by integrating the current flowing in recharging the photodiode 121 to the reverse-biased state.

In reading the signal charge, the voltage at the terminal of the thin-film transistor 122 connected to the data line 106 is higher than the voltage at the terminal connected to the photodiode 121. Accordingly, in signal charge detection, the terminal connected to the data line 106 is the drain and the terminal connected to the photodiode 121 is the source. The pixel 13 can include an additional element not shown in FIG. 2, such as an additional thin-film transistor.

Examples of Pixel Structure

Figure 3A:
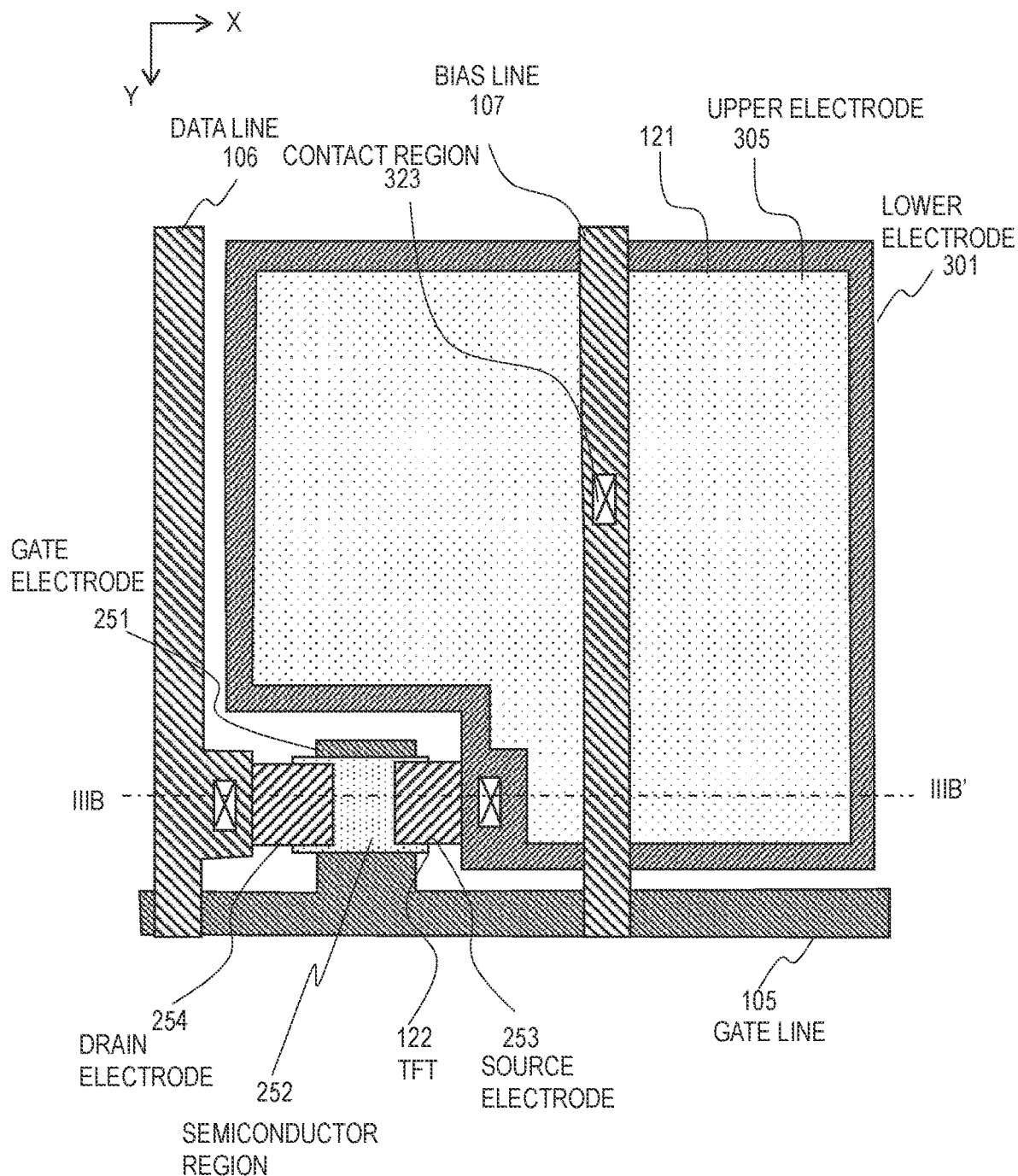
FIG. 3A is a plan diagram schematically illustrating an example of the structure of a pixel inclusive of a gate line, a data line, and a bias line.

Hereinafter, some examples of the device structure of a pixel 13 are described. FIG. 3A is a plan diagram schematically illustrating an example of the structure of a pixel 13 inclusive of a gate line 105, a data line 106, and a bias line 107. In FIG. 3A, the data line 106 extends vertically (in the Y-direction); the gate line 105 extends horizontally (in the X-direction); and a thin-film transistor 122 is disposed at the intersection of these lines.

The pixel 13 includes a lower electrode 301 and an upper electrode 305. In the configuration example of FIG. 3A, the upper electrode 305 overlaps the lower electrode 301 in its entirety when viewed planarly (in the layering direction). In other words, the whole area of the upper electrode 305 is included in the area of the lower electrode 301 when viewed planarly.

The photodiode 121 includes photodiode semiconductor layers consisting of p-n or p-i-n layers, for example, and an upper electrode and a lower electrode sandwiching the photodiode semiconductor layers. In the configuration example of FIG. 3A, the outer ends of the upper electrode 305 and the photodiode semiconductor layers of the photodiode 121 can either coincide or differ when viewed planarly. For example, the upper electrode 305 can have a smaller area than the photodiode semiconductor layers. The region of the lower electrode 301 in contact with the photodiode semiconductor layers works as the lower electrode of the photodiode 121. The pixel 13 includes a thin-film transistor 122 and a bias line 107. The thin-film transistor 122 includes a gate electrode 251, an island-like semiconductor region 252, a source electrode 253, and a drain electrode 254.

The bias line 107 extends vertically (in the Y-direction) in FIG. 3A. The bias line 107 is on a layer upper than the upper electrode 305 and is connected to the upper electrodes 305 of a plurality of pixels 13 via contact regions 323. The bias line 107 lies above the upper electrode 305 in such a fashion that the bias line 107 passes through one end of the upper electrode 305 and the opposite end. The bias line 107 transmits a bias potential and supplies the bias potential to the upper electrode 305 of the photodiode 121.

In the configuration example of FIG. 3A, the lower electrode 301 and the upper electrode 305 overlap neither the gate line 105 nor the data line 106 but are distant from them when viewed planarly. The lower electrode 301 and the upper electrode 305 do not overlap the semiconductor region 252 either but are distant from it when viewed planarly. It should be noted that the pixel structure illustrated in FIG. 3A is merely an example and a pixel 13 can have a different structure.

Figure 3B:
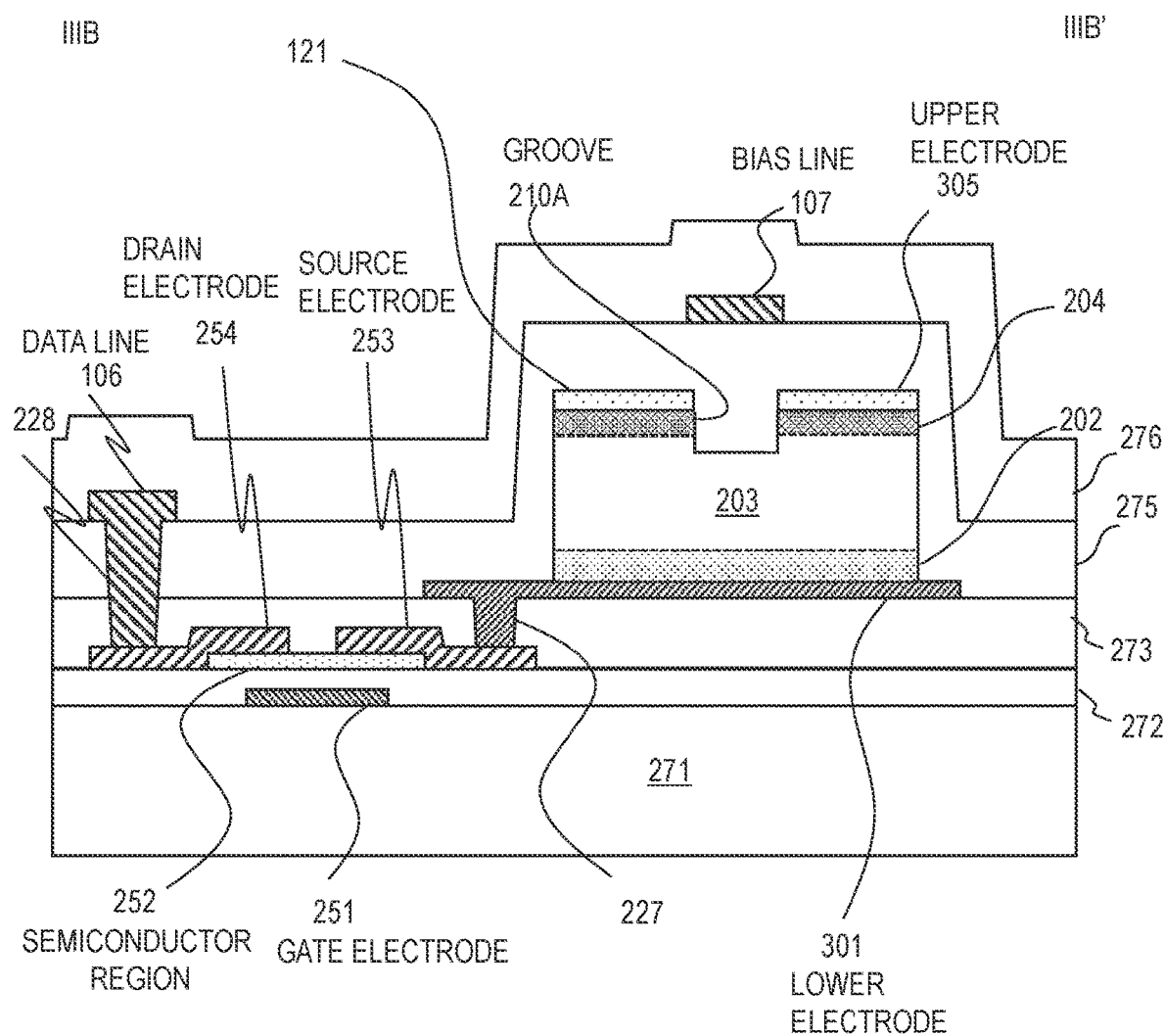
FIG. 3B is a cross-sectional diagram along the section line IIIB-IIIB' in FIG. 3A.

FIG. 3B is a cross-sectional diagram along the section line IIIB-IIIB' in FIG. 3A. The drawings referred to hereinafter may omit reference signs of some elements. With reference to FIG. 3B, the thin-film transistor 122 includes a gate electrode 251 provided on an insulating substrate 271, a gate insulating layer 272 above the gate electrode 251, and a semiconductor region 252 above the gate insulating layer 272. As to the relation between two layers, the layer closer to the substrate 271 is referred to as a lower layer and the layer farther from the substrate 271 as an upper layer.

As illustrated in FIG. 3A, the gate electrode 251 is projecting vertically (upward in FIG. 3A) from the gate line 105 extending horizontally (in the X-direction). The gate electrode 251 and the gate line 105 are provided on the insulating substrate (insulating layer) 271 and these are included in the same conductor layer. A silicon insulating layer can be interposed between the insulating substrate 271 and the layer of the gate electrode 251 and the gate line 105.

Separated or unseparated conductor regions included in the same conductor layer are made of the same material and disposed on the same insulating layer in direct contact with the insulating layer. In manufacture, the conductor regions of the same conductor layer are produced in the same process. The conductor layer can have a single layer structure or multi-layered structure.

In this configuration example, the thin-film transistor 122 has a bottom-gate structure; the gate electrode 251 is disposed under the semiconductor region 252. The thin-film transistor 122 further includes a source electrode 253 and a drain electrode 254 above the gate insulating layer 272. The source electrode 253 and the drain electrode 254 are included in the same conductor layer. The thin-film transistor can have a top-gate structure.

In accordance with the flow of carriers during detection of electric charge of the photodiode 121, the electrode 253 becomes a source electrode and the electrode 254 becomes a drain electrode. The source electrode 253 and the drain electrode 254 overlap the semiconductor region 252 when viewed planarly. The source electrode 253 and the drain electrode 254 are in direct contact with the semiconductor region 252. Each of the source electrode 253 and the drain electrode 254 is formed to contact a side face and a part of the top face of the island-like semiconductor region 252.

The gate insulating layer 272 is provided to cover the entire gate electrode 251. The gate insulating layer 272 is provided between the gate electrode 251 and the semiconductor region 252. A first interlayer insulating layer 273 is provided to cover the entire thin-film transistor 122. Specifically, the first interlayer insulating layer 273 covers the top face of the semiconductor region 252 and the top faces of the source electrode 253 and the drain electrode 254.

The substrate 271 can be made of glass or resin. The gate electrode 251 is made of a conductor and can be a film of a metal such as Al, Mo, Cr, Ti, or Cu or an alloy of such a metal, or a layered film of these materials. The gate insulating layer 272 can be made of an insulating material expressed as SiNxOy (x and y can include 0) or $Al_2O_3$, or can be a layered film of these materials.

The semiconductor for the semiconductor region 252 can be an oxide semiconductor. The oxide semiconductor contains at least one of In, Ga, and Zn; examples of the oxide semiconductor include amorphous InGaZnO (a-InGaZnO) and microcrystalline InGaZnO. The semiconductor can be amorphous silicon or polysilicon.

The source electrode 253 and the drain electrode 254 are made of a conductor and can be a film of a metal such as Al, Mo, Cr, Ti, or Cu or an alloy of such a metal, or a layered film of these materials. The first interlayer insulating layer 273 can be made of an organic or inorganic insulator. The first interlayer insulating layer 273 can be made of an insulating material expressed as SiNxOy (x and y include 0) or $Al_2O_3$, or can be a layered film of these materials.

The lower electrode 301 is connected to the conductor film including the source electrode 253 of the thin-film transistor 122 via a contact region 227 in a via hole opened through the first interlayer insulating layer 273. The lower electrode 301 is made of a conductor and can be a film of a metal such as Al, Mo, Cr, Ti, or Cu or an alloy of such a metal, or a layered film of these materials.

The photodiode 121 consists of a photoelectric conversion region sandwiched between the lower electrode 301 and the upper electrode 305 and parts of the lower electrode 301 and the upper electrode 305 that are in contact with the photoelectric conversion region. The example of the photodiode 121 illustrated in FIG. 3B is a PIN diode. A PIN diode generates a thick depletion layer to enable efficient light detection. The upper electrode 305 is an electrode transparent to the light from the scintillator; it can be made of ITO.

The photoelectric conversion region of the photodiode 121 includes an n-type amorphous silicon layer (film) 202 (second semiconductor layer) above the lower electrode 301, an intrinsic amorphous silicon layer (film) 203 (second or third semiconductor layer) above the n-type amorphous silicon layer 202, and a p-type amorphous silicon layer (film) 204 (first semiconductor layer) above the intrinsic amorphous silicon layer 203. The photodiode semiconductor layers in this example are three semiconductor layers 202, 203, and 204 laid one above another. The n-type amorphous silicon layer and the p-type amorphous silicon layer are examples of an impurity-doped semiconductor layer.

The n-type amorphous silicon layer 202 can be made of amorphous silicon hydride doped with phosphorus. The p-type amorphous silicon layer 204 can be made of amorphous silicon hydride doped with boron. The n-type amorphous silicon layer and p-type amorphous silicon layer can be simply referred to as n-layer and p-layer, respectively.

In this configuration example, the n-type amorphous silicon layer 202 is in direct contact with the lower electrode 301. The upper electrode 305 is provided above the p-type amorphous silicon layer 204. The upper electrode 305 in this configuration example is in direct contact with the p-type amorphous silicon layer 204. The light to be detected enters the photodiode 121 from above the upper electrode 305. The disposition of the n-type amorphous silicon layer 202 and the p-type amorphous silicon layer 204 can be opposite and further, the intrinsic amorphous silicon layer 203 can be excluded.

A second interlayer insulating layer 275 is provided to cover the lower electrode 301, the silicon layers 202 to 204, and the upper electrode 305. The second interlayer insulating layer 275 can be made of an organic or inorganic insulator. The second interlayer insulating layer 275 can be made of SiNxOy (x and y include 0), acrylic resin, phenol resin, or epoxy resin, or can be a layered film of these materials.

A bias line 107 and a data line 106 are provided above the second interlayer insulating layer 275. The bias line 107 and the data line 106 in this example are in direct contact with the second interlayer insulating layer 275. The data line 106 is connected to the conductor film including the drain electrode 254 of the thin-film transistor 122 via a contact region 228 in a via hole opened through the second interlayer insulating layer 275 and the first interlayer insulating layer 273.

The bias line 107 is connected to the upper electrode 305 via a contact region 323 provided in a via hole opened through the second interlayer insulating layer 275. The bias line 107 and the data line 106 are made of a conductor and can be a film of a metal such as Al, Mo, Cr, Ti, or Cu or an alloy of such a metal, or a layered film of these materials. The bias line 107 is non-transmissive (untransparent) to the light to be converted by the photodiode 121 into electricity. The data line 106 can be made of a transmissive material such as ITO. The non-light-transmissive metal material includes various substances having preferable characteristics, which expands the range of design.

A passivation layer 276 is provided to cover the data line 106, the bias line 107, and the second interlayer insulating layer 275. The passivation layer 276 covers the whole detection region 12. The passivation layer 276 is made of an organic or inorganic insulator. The passivation layer 276 can be made of SiNxOy (x and y include 0), acrylic resin, phenol resin, or epoxy resin, or a layered film of these materials. Not-shown scintillator is provided above the passivation layer 276.

The not-shown scintillator covers the whole detection region 12. The scintillator emits light by being excited by radioactive rays. Specifically, the scintillator converts received x-rays into light having a wavelength detectable for the photodiode 121. The photodiode 121 generates signal charge in response to the light from the scintillator and stores the signal charge to the capacitive component of the pixel 13.

In an embodiment of this specification, the photodiode semiconductor layers have a groove 210A in the upper part. When the groove 210A is viewed planarly, the p-type amorphous silicon layer 204 is partially removed. In the example of FIG. 3B, the intrinsic amorphous silicon layer 203 is also removed to the middle of its thickness. Removal of the intrinsic amorphous silicon layer 203 is optional. In a planar view, the upper electrode 305 is not provided in the region overlapping the groove 210A. In other words, the groove 210A is located outside the region covered with the upper electrode 305.

Within the groove 210A, the entire upper electrode 305, the entire p-type amorphous silicon layer 204, and an upper part of the intrinsic amorphous silicon layer 203 are removed. The groove 210A extends in the lengthwise direction of the bias line 107 (Y-direction) and has two inner side walls opposed to each other in the widthwise direction.

Each inner side wall is composed of a side face of the upper electrode 305, a side face of the p-type amorphous silicon layer 204, and an inner side wall of a groove of the intrinsic amorphous silicon layer 203 located one above another. The bottom of the groove 210A is a part of the top face of the intrinsic amorphous silicon layer 203. Making a groove in the intrinsic amorphous silicon layer 203 ensures removal of the p-type amorphous silicon layer 204.

In other words, side faces of the upper electrode 305 and the p-type amorphous silicon layer 204 are exposed in the groove 210A. Furthermore, the inner side walls of the groove in the intrinsic amorphous silicon layer 203 and a part of the top face (the bottom of the groove) of the intrinsic amorphous silicon layer 203 are exposed in the groove 210A. The groove 210A is filled with the second interlayer insulating layer 275.

In a planar view, at least a part of the groove 210A is covered with the bias line 107. In the example of FIG. 3B, the left and right ends of the bias line 107 coincide with the left and right ends (the left and right inner walls) of the groove 210A. The width or the size in the horizontal direction in FIG. 3B of the groove 210A can be either smaller or larger than the width of the bias line 107. For example, only either the left ends or the right ends of the groove 210A and the bias line 107 can coincide and the other ends can differ in a planar view. Both of the left end and the right end of the bias line 107 can be located within the groove 210A in a planar view. Both or either one of the left end and the right end of the bias line 107 can be located outside the groove 210A in a planar view.

In the example of FIG. 3B, the upper doped silicon layer (the p-type amorphous silicon layer 204) of the thick amorphous silicon layers (photodiode semiconductor layers) consisting of p-i-n layers is partially removed in the region covered with the bias line 107. Since most of the kTC noise is caused by the junction capacitance of the photodiode 121 and the junction capacitance is proportional to the area of the p-layer and the n-layer opposed to each other, removing the upper doped silicon layer reduces the junction capacitance and accordingly, the kTC noise decreases.

At least a part or the entirety of the groove 210A is located under the non-light-transmissive bias line 107 and covered with the bias line 107. Accordingly, the reduction in photo-electric conversion efficiency caused by providing the groove 210A can be suppressed. In the example of FIG. 3B, the intrinsic amorphous silicon layer 203 partially remains in its thickness and its top face works as the bottom of the groove 210A. This configuration attains a shallow groove 210A, compared to the configuration where the entire intrinsic amorphous silicon layer 203 and moreover, the n-type amorphous silicon layer 202 thereunder are removed. The shallow groove 210A reduces the possibility that the groove produces a large difference in height for the bias line because of its large depth and adversely affects the shape of the bias line 107 by generating disconnection, for example.

Figure 3C:
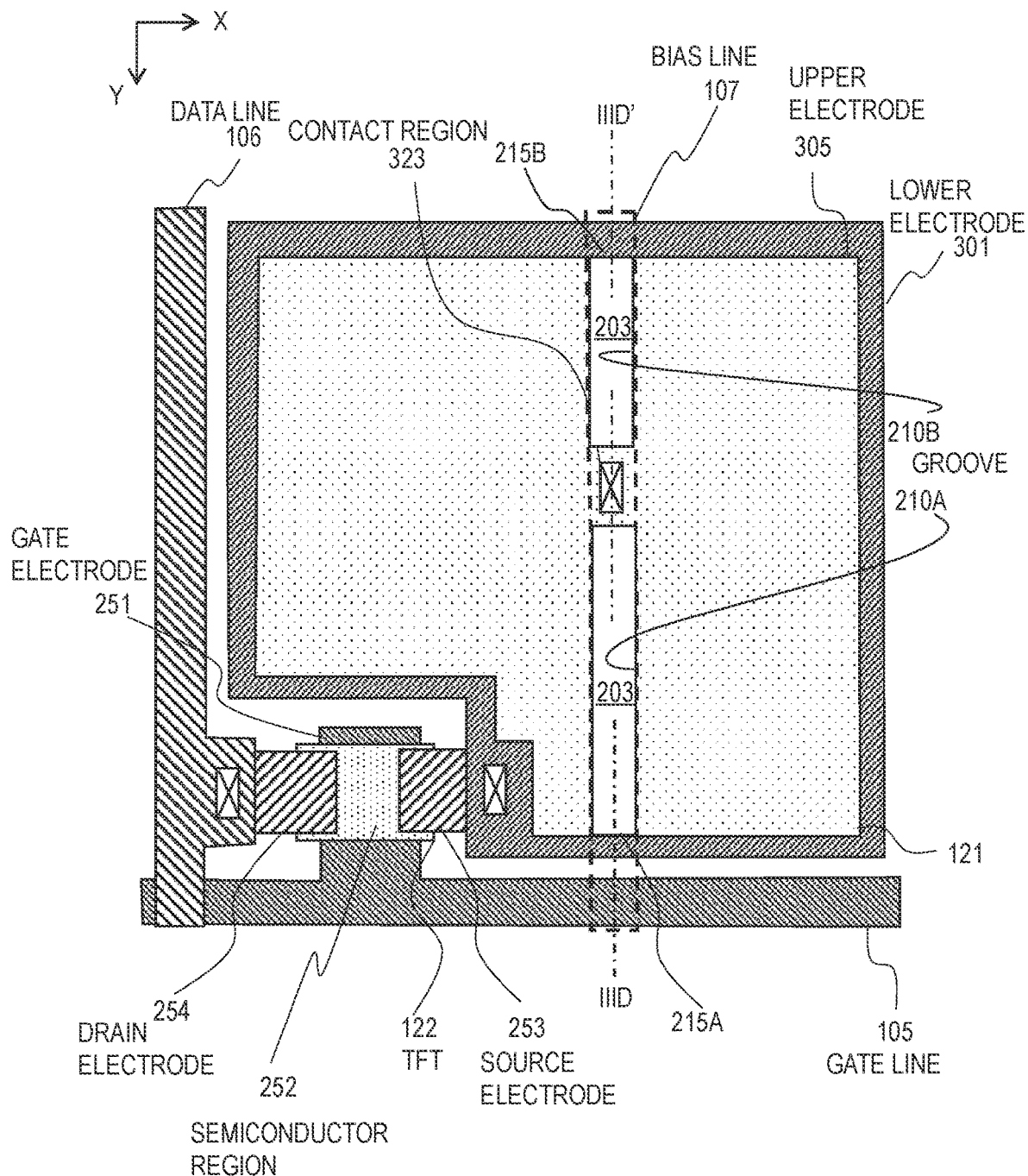
FIG. 3C is another plan diagram schematically illustrating the foregoing example of the structure of a pixel inclusive of a gate line, a data line, and a bias line.

FIG. 3C is another plan diagram schematically illustrating the above-described example of the structure of a pixel 13 inclusive of a gate line 105, a data line 106, and a bias line 107. FIG. 3C shows only the outline of the bias line 107 by a dashed line and illustrates grooves 210A and 210B and the intrinsic amorphous silicon layer 203 under the bias line 107 through the bias line 107. The remaining is the same as FIG. 3A.

FIG. 3C includes two grooves 210A and 210B sandwiching the contact region 323. One of the grooves 210A and 210B is optional. In the grooves 210A and 210B, the p-type amorphous silicon layer 204 is removed and the intrinsic amorphous silicon layer 203 is exposed, as described with reference to FIG. 3B.

The grooves 210A and 210B extend in the Y-direction in FIG. 3C under the bias line 107. In this example, the widths (the sizes in the X-direction) of the grooves 210A and 210B coincide with the width of the bias line 107 and their ends coincide with the ends of the bias line 107, when viewed planarly. One end in the Y-direction (the upper end in FIG. 3C) of the groove 210B coincides with the end 215B of the upper electrode 305 and the photodiode semiconductor layers. The other end in the Y-direction (the lower end in FIG. 3C) of the groove 210A coincides with the end 215A of the upper electrode 305 and the photodiode semiconductor layers of the photodiode 121.

As understood from the above, the bias line 107 crosses one end (the upper end in FIG. 3C) of the n-type amorphous silicon layer 202 and the groove 210B includes the end, when viewed planarly. Furthermore, the bias line 107 crosses another end (the lower end in FIG. 3C) of the n-type amorphous silicon layer 202 and the groove 210A includes the end, when viewed planarly.

Figure 3D:
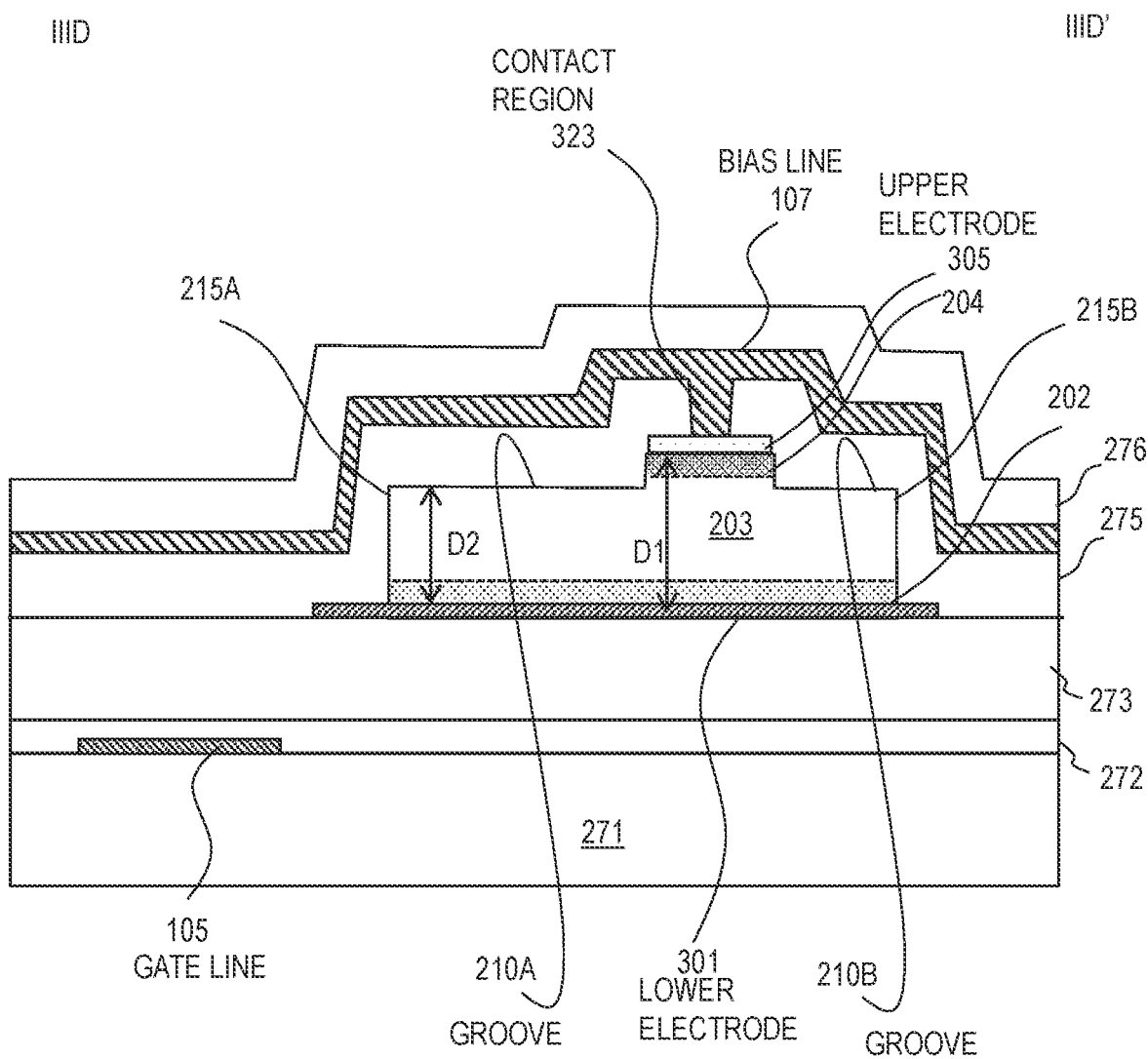
FIG. 3D is a cross-sectional diagram along the section line IIID-IIID' in FIG. 3C.

FIG. 3D is a cross-sectional diagram along the section line IIID-IIID' in FIG. 3C. The bias line 107 is connected to the upper electrode 305 via the contact region 323. The two grooves 210A and 210B each extend to reach an end 215A or 215B of the photodiode semiconductor layers or the remaining n-type amorphous silicon layer 202 and intrinsic amorphous silicon layer 203. In FIG. 3D, the photodiode semiconductor layers are removed in the upper parts of the left and right ends 215A and 215B, the left and right ends 215A and 215B are located within the grooves 210A and 210B.

In FIG. 3D, the thickness of the photodiode 121 in the region where the grooves 210A and 210B are provided, or the thickness D2 at an end of the photodiode semiconductor layers, is smaller than the thickness D1 of the photodiode 121 in the region around the contact region 323 where neither the groove 210A nor the groove 210B are provided and the p-type amorphous silicon layer 204 is remaining.

The photodiode semiconductor layers are produced thick in order to absorb light effectively. For this reason, the bias line 107 crossing the photodiode semiconductor layers is provided with a large height difference at an end of the photodiode semiconductor layers. As a result, disconnection of the bias line 107 occurs frequently. Providing the grooves 210A and 210B by partially removing the upper part of the photodiode semiconductor layers forms steps, which reduce the height difference for the bias line 107 at the end of the photodiode semiconductor layers. Accordingly, the coatability at the height difference improves to reduce the frequency of disconnection of the bias line 107.

Depending on the design of the grooves, the intrinsic amorphous silicon layer of the photodiode semiconductor layers can be completely removed in the layering direction.

Example of Manufacturing Method

Figure 4A:
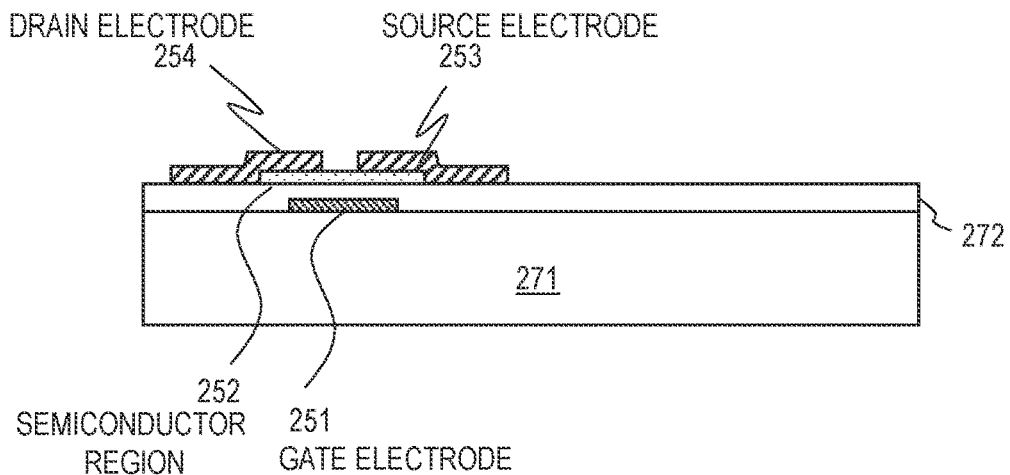
FIG. 4A schematically illustrates a layered structure on an insulating substrate at a step of a manufacturing method.

Hereinafter, an example of the method of manufacturing a sensor panel 11 (pixel 13) is described. FIGS. 4A to 4G schematically illustrate the layered structure on an insulating substrate 271 at different steps in a manufacturing method. With reference to FIG. 4A, the method produces a gate electrode 251 (including a gate line not shown in FIG. 4A) on a insulating substrate 271 by sputtering and etching and further, produces a gate insulating layer 272 by chemical vapor deposition (CVD) to cover the gate electrode 251 on the insulating substrate 271. Next, the method produces a semiconductor region 252 by sputtering or CVD and etching and further, produces a source electrode 253 and a drain electrode 254 by sputtering and etching.

Figure 4B:
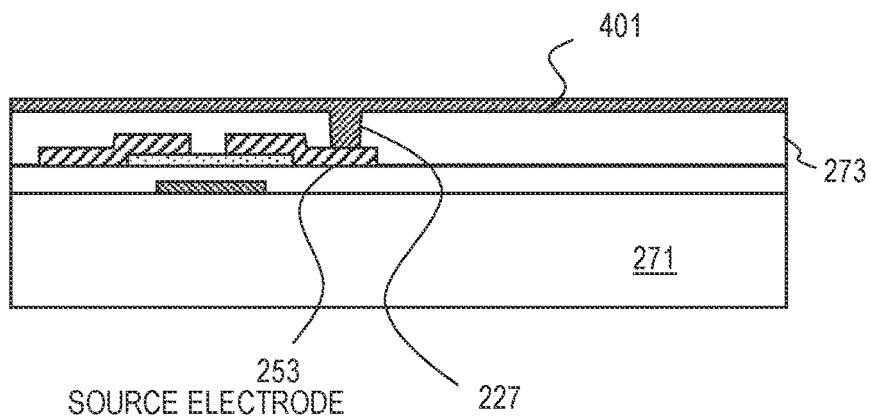
FIG. 4B schematically illustrates the layered structure on the insulating substrate at another step of the manufacturing method.

With reference to FIG. 4B, the method produces a first interlayer insulating layer 273 by CVD to cover the TFT and opens a hole for a contact by etching. Next, the method produces a metal layer 401 including a lower electrode 301 by sputtering. A contact region 227 fills the hole in the first interlayer insulating layer 273 and directly contacts the source electrode 253.

Figure 4C:
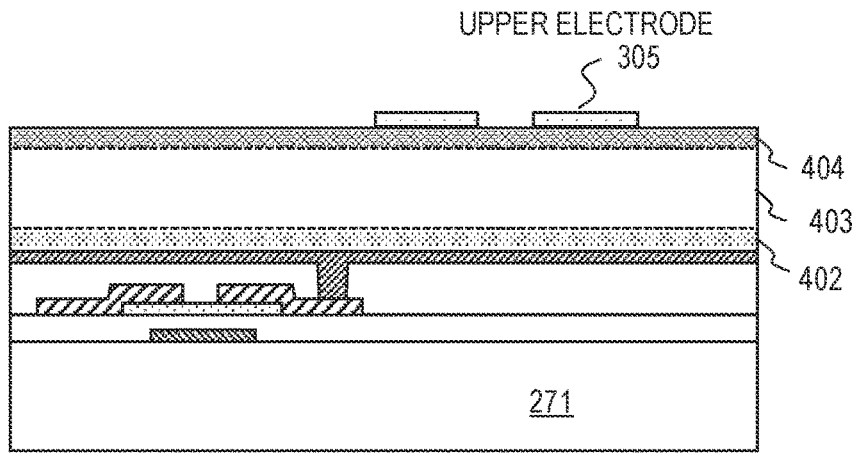
FIG. 4C schematically illustrates the layered structure on the insulating substrate at still another step of the manufacturing method.

With reference to FIG. 4C, the method deposits an n-type amorphous silicon layer 402, an intrinsic amorphous silicon layer 403, and a p-type amorphous silicon layer 404 one above another. The n-type amorphous silicon layer 402 can be produced by depositing an amorphous silicon layer by CVD and doping the layer with phosphorus. The p-type amorphous silicon layer 404 can be produced by depositing an amorphous silicon layer by CVD and doping the layer with boron. Parts of these amorphous silicon layers 402, 403, and 404 are included in a photodiode 121.

Next, the method produces an upper electrode 305 above the p-type amorphous silicon layer 404 by sputtering and etching. The upper electrode 305 has openings where the upper electrode is removed by etching to make grooves 210A and 210B of the photodiode 121.

Figure 4D:
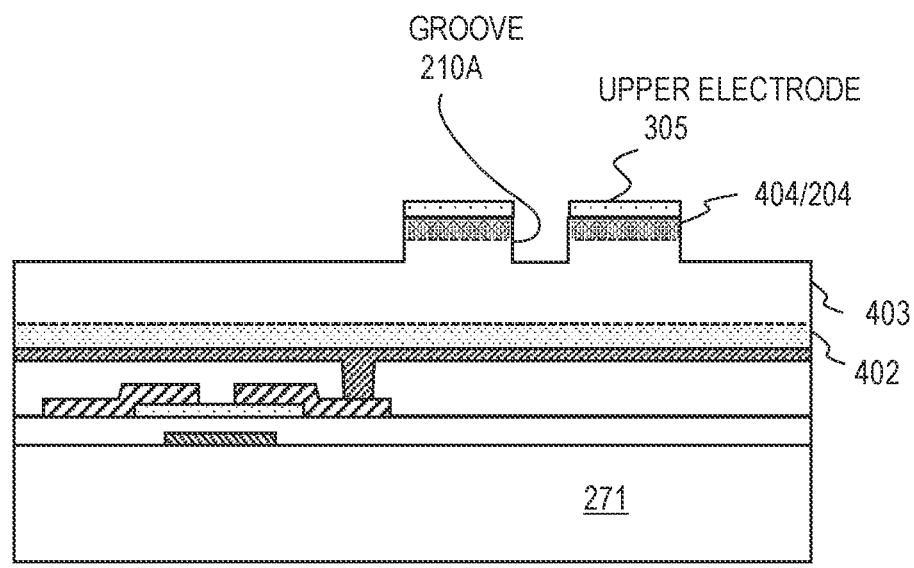
FIG. 4D schematically illustrates the layered structure on the insulating substrate at still another step of the manufacturing method.

With reference to FIG. 4D, the method removes a part of the p-type amorphous silicon layer 404 and a part of the intrinsic amorphous silicon layer 403 by etching using the upper electrode 305 as a mask. Alternatively, the method can use a not-shown patterned photoresist provided above the upper electrode 305 as a mask. In the region to be removed, the p-type amorphous silicon layer 404 is completely removed and the intrinsic amorphous silicon layer 403 is removed to the middle of its thickness. Although the widths of the openings of the upper electrode 305, the p-type amorphous silicon layer 404, and the intrinsic amorphous silicon layer 403 are equal in the example in FIG. 4D, they can be different.

Figure 4E:
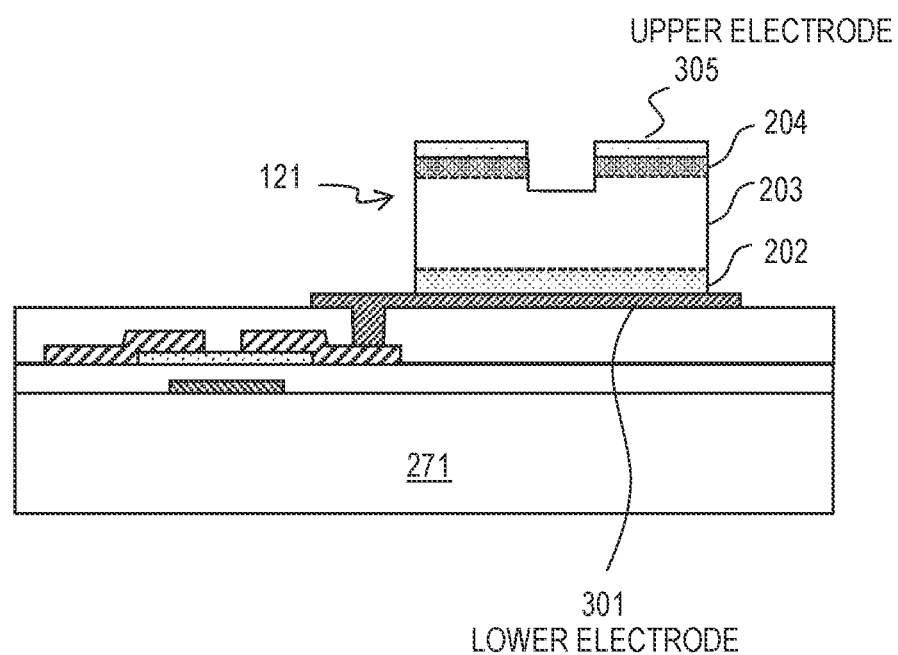
FIG. 4E schematically illustrates the layered structure on the insulating substrate at still another step of the manufacturing method.

With reference to FIG. 4E, the method removes the unnecessary regions of the intrinsic amorphous silicon layer 403, the n-type amorphous silicon layer 402, and the metal layer 401 by etching utilizing photolithography to form a lower electrode 301 and amorphous silicon layers 202, 203, and 204 of the photodiode 121.

Figure 4F:
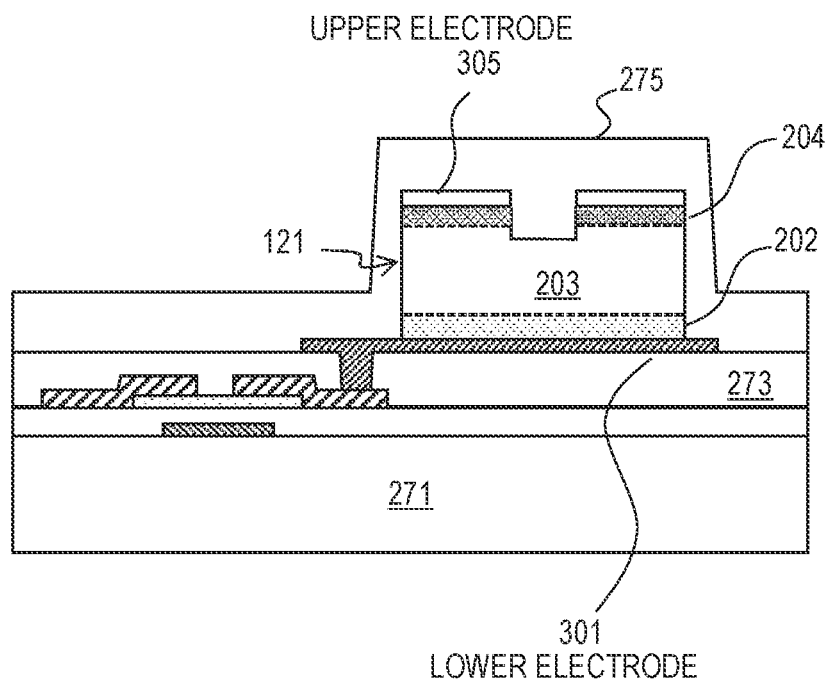
FIG. 4F schematically illustrates the layered structure on the insulating substrate at still another step of the manufacturing method.
Figure 4G:
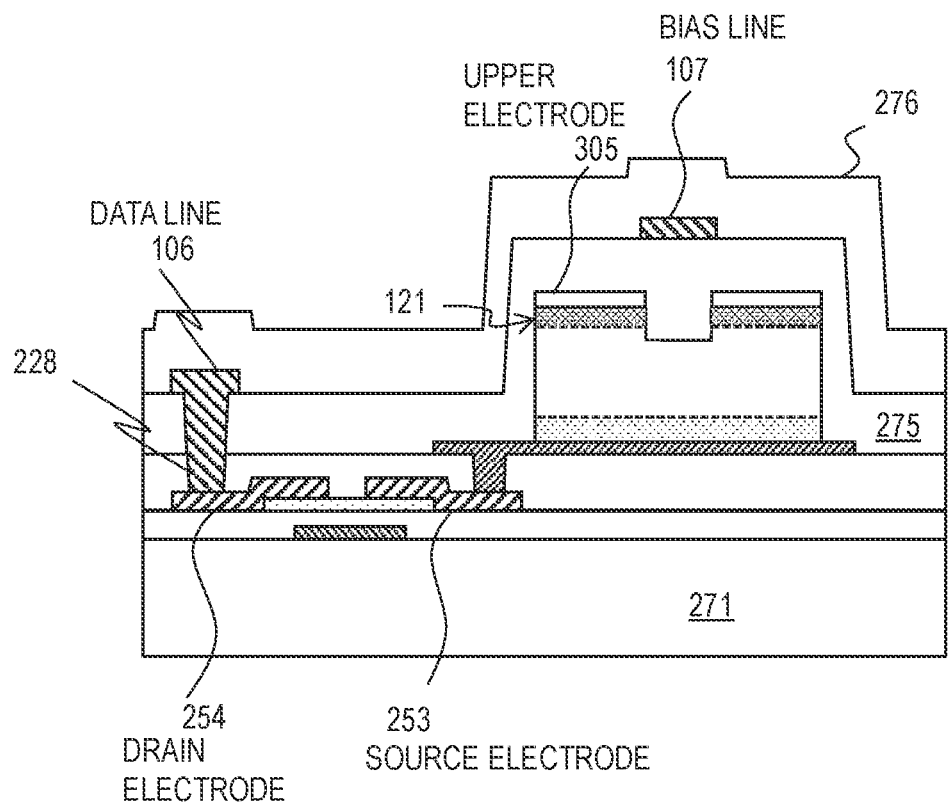
FIG. 4G schematically illustrates the layered structure on the insulating substrate at still another step of the manufacturing method.

With reference to FIG. 4F, the method deposits a second interlayer insulating layer 275 by CVD to cover the photodiode 121 and the first interlayer insulating layer 273. With reference to FIG. 4G, the method opens contact holes in the second interlayer insulating layer 275 by etching and subsequently, produces a bias line 107 and a data line 106 by sputtering and etching. The data line 106 is connected to the drain electrode 254 via the contact region 228. The bias line 107 is connected to the upper electrode 305 through a contact region 323 not shown in FIG. 4G. Next, the method deposits a passivation layer 276 by CVD to cover the entire detection region 12.

Embodiment 2

Figure 5A:
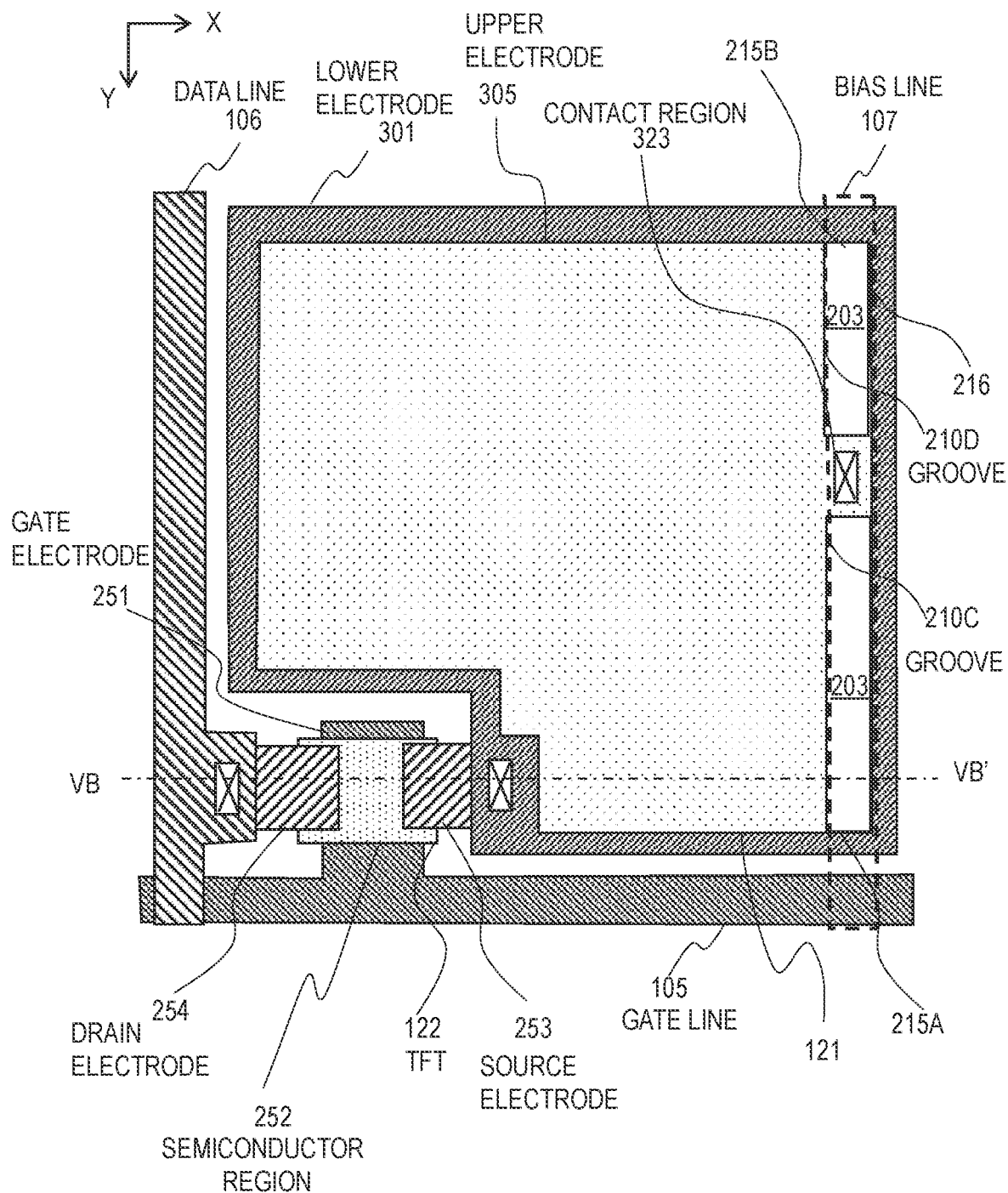
FIG. 5A is a plan diagram schematically illustrating another example of the structure of a pixel inclusive of a gate line, a data line, and a bias line.

Another example of the structure of the detection region 12 is described. FIG. 5A is a plan diagram schematically illustrating another example of the structure of a pixel 13 inclusive of a gate line 105, a data line 106, and a bias line 107. FIG. 5A shows only the outline of the bias line 107 by a dashed line and illustrates grooves 210C and 210D and the intrinsic amorphous silicon layer 203 under the bias line 107 through the bias line 107. In the following, differences from the configuration described with reference to FIGS. 3A to 3D are mainly described.

The bias line 107 in the example of FIG. 5A is located differently from the bias line 107 in FIG. 3A. The bias line 107 in FIG. 5A extends in the Y-direction along the right end 216 of the photodiode (semiconductor layers) 121 and covers the right end 216. Two grooves 210C and 210D sandwiching a contact region 323 in the Y-direction are provided under the bias line 107. One of the grooves 210C and 210D can be optional. In a planar view, the upper electrode 305 is not included in the regions overlapping the groove 210C or 210D. The grooves 210C and 210D are located outside the region covered with the upper electrode 305.

One end in the lengthwise direction (Y-direction) of the groove 210C coincides with the end 215A of the photodiode semiconductor layers. One end in the widthwise direction (X-direction) of the groove 210C coincides with the end 216 of the photodiode semiconductor layers. As understood from this description, a part of the groove 210C coincides with the end 215A of the photodiode semiconductor layers and another part coincides with the end 216, when viewed planarly.

One end in the lengthwise direction (Y-direction) of the groove 210D coincides with the end 215B of the photodiode semiconductor layers. One end in the widthwise direction (X-direction) of the groove 210D coincides with the end 216 of the photodiode semiconductor layers. A part of the groove 210D coincides with the end 215B of the photodiode semiconductor layers and another part coincides with the end 216, when viewed planarly.

The end 216 of the photodiode semiconductor layers consists of the ends of the remaining n-type amorphous silicon layer 202 and intrinsic amorphous silicon layer 203 located one above the other. The grooves 210C and 210D can have the same width and the same depth.

Figure 5B:
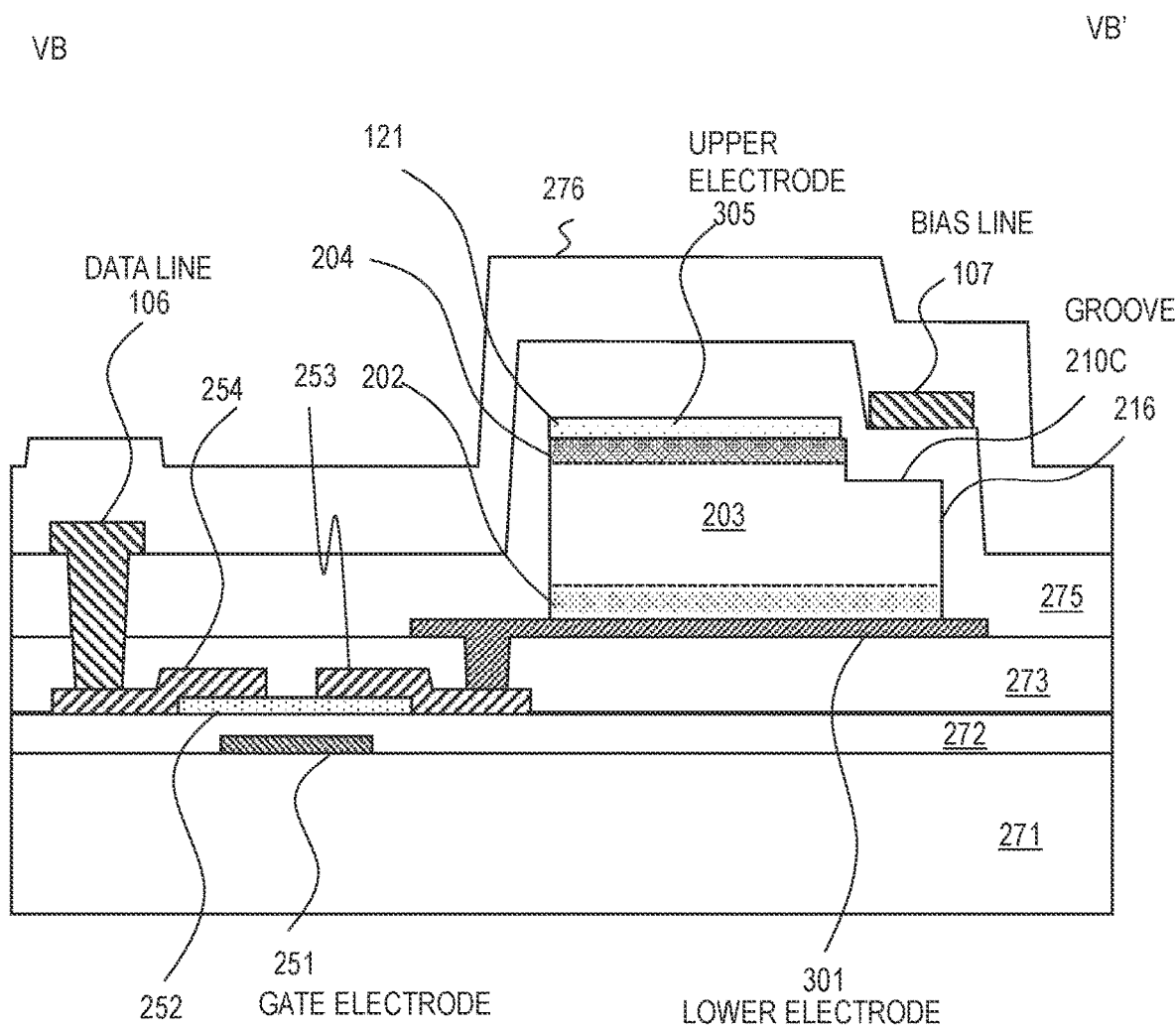
FIG. 5B is a cross-sectional diagram along the section line VB-VB' in FIG. 5A.

FIG. 5B is a cross-sectional diagram along the section line VB-VB' in FIG. 5A. The groove 210C reaches the end 216 of the photodiode semiconductor layers of the photodiode 121. In FIG. 5B, the upper right of the photodiode 121 is partially removed to form the groove 210C.

The groove 210C extends in the lengthwise direction of the bias line 107 and has an inner side wall only one side in the widthwise direction. The inner side wall is composed of a side face of the upper electrode 305, a side face of the p-type amorphous silicon layer 204, and the inner side wall of the groove of the intrinsic amorphous silicon layer 203 located one above another. The opposite side of the inner side wall of the groove 210C is open.

The groove 210C is formed by removing the right end and its vicinity of the photodiode 121. Accordingly, the right end of the photodiode 121 has a height lower than the other part. The groove 210C is filled with the second interlayer insulating layer 275. The description of the groove 210C provided with reference to FIG. 5B is applicable to the groove 210D.

The grooves 210C and 210D are located under the non-light-transmissive bias line 107 and covered with the bias line 107 in at least a part or the entirety of their regions. Accordingly, the reduction in photoelectric conversion efficiency caused by providing the grooves 210C and 210D can be suppressed.

As illustrated in FIG. 5B, the grooves 210C and 210D do not have one inner side wall and their one end in the widthwise direction is open. The end face (side wall) 216 of the photodiode semiconductor layers has a low height in the regions where the groove 210C or 210D is provided because of the groove 210C or 210D.

Providing a groove along the end of the photodiode semiconductor layers reduces the exposed area of the side wall of the photodiode that is expected to be damaged by etching. Less etching damage reduces generation of defect levels in the photodiode, which suppresses increase in dark current.

Figure 6:
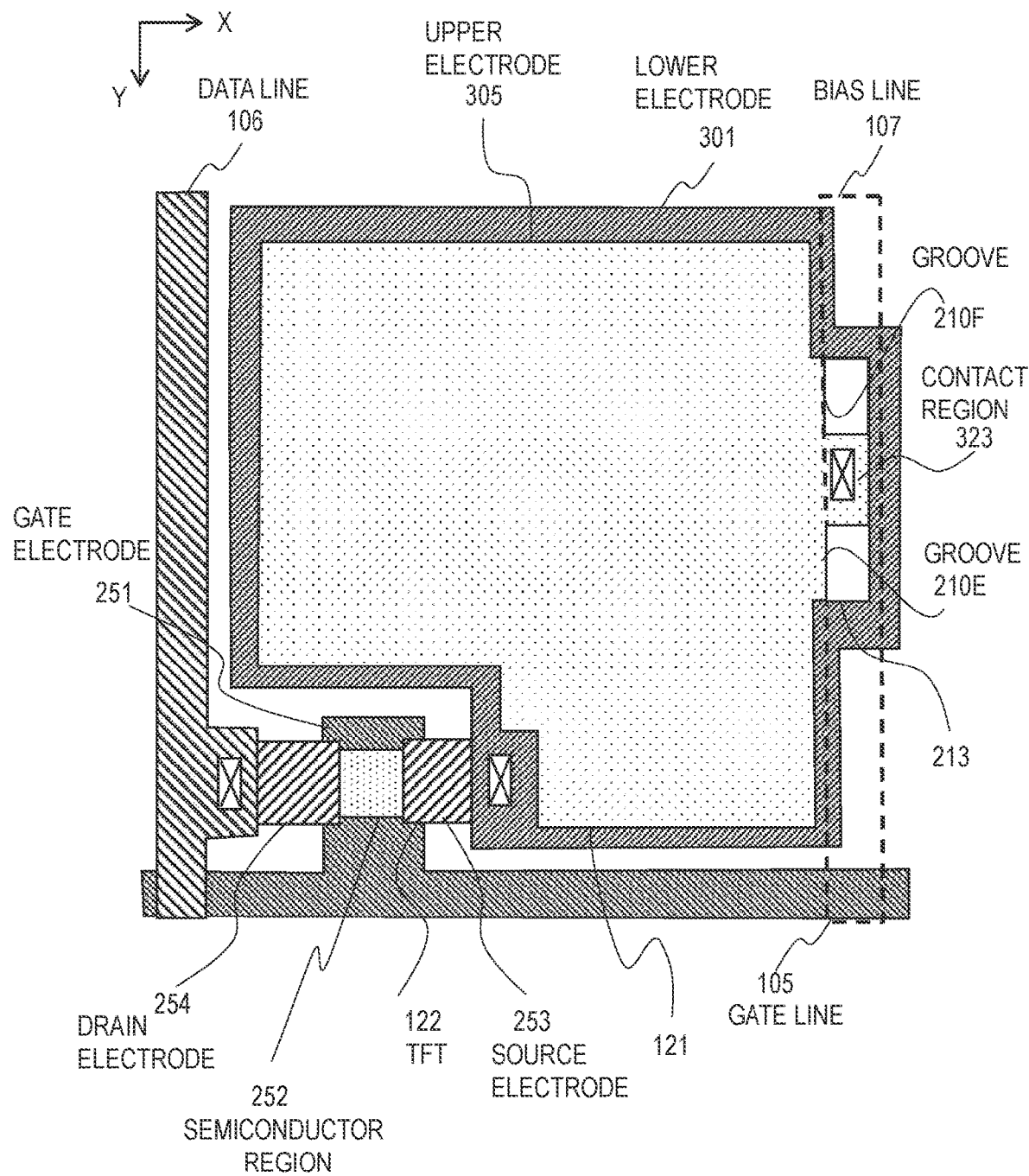
FIG. 6 is a plan diagram schematically illustrating still another example of the structure of a pixel inclusive of a gate line, a data line, and a bias line.

Still another example of the structure of the detection region 12 is described. FIG. 6 is a plan diagram schematically illustrating still another example of the structure of a pixel 13 inclusive of a gate line 105, a data line 106, and a bias line 107. FIG. 6 shows only the outline of the bias line 107 by a dashed line and illustrates grooves 210E and 210F and the intrinsic amorphous silicon layer 203 under the bias line 107 through the bias line 107. In the following, differences from the configuration described with reference to FIGS. 5A and 5B are mainly described.

The photodiode semiconductor layers have a projected region 213. A projected region of the upper electrode 305 covers a part of the projected region 213 and a contact region 323 is provided in the overlap region. The bias line 107 covers at least a part of the projected region 213 and does not cover the region other than the projected region 213 of the photodiode semiconductor layers. The grooves 210E and 210F sandwiching the contact region 323 are formed by partially removing an upper part of the projected region 213. One of the grooves 210E and 210F can be optional. In a planar view, the upper electrode 305 is not provided in the regions overlapping the groove 210E or 210F. The grooves 210E and 210F are located outside the region covered with the upper electrode 305. The grooves 210E and 210F have lengths shorter than the grooves 210C and 210D in FIG. 5A in the lengthwise direction (Y-direction).

Embodiment 3

Figure 7:
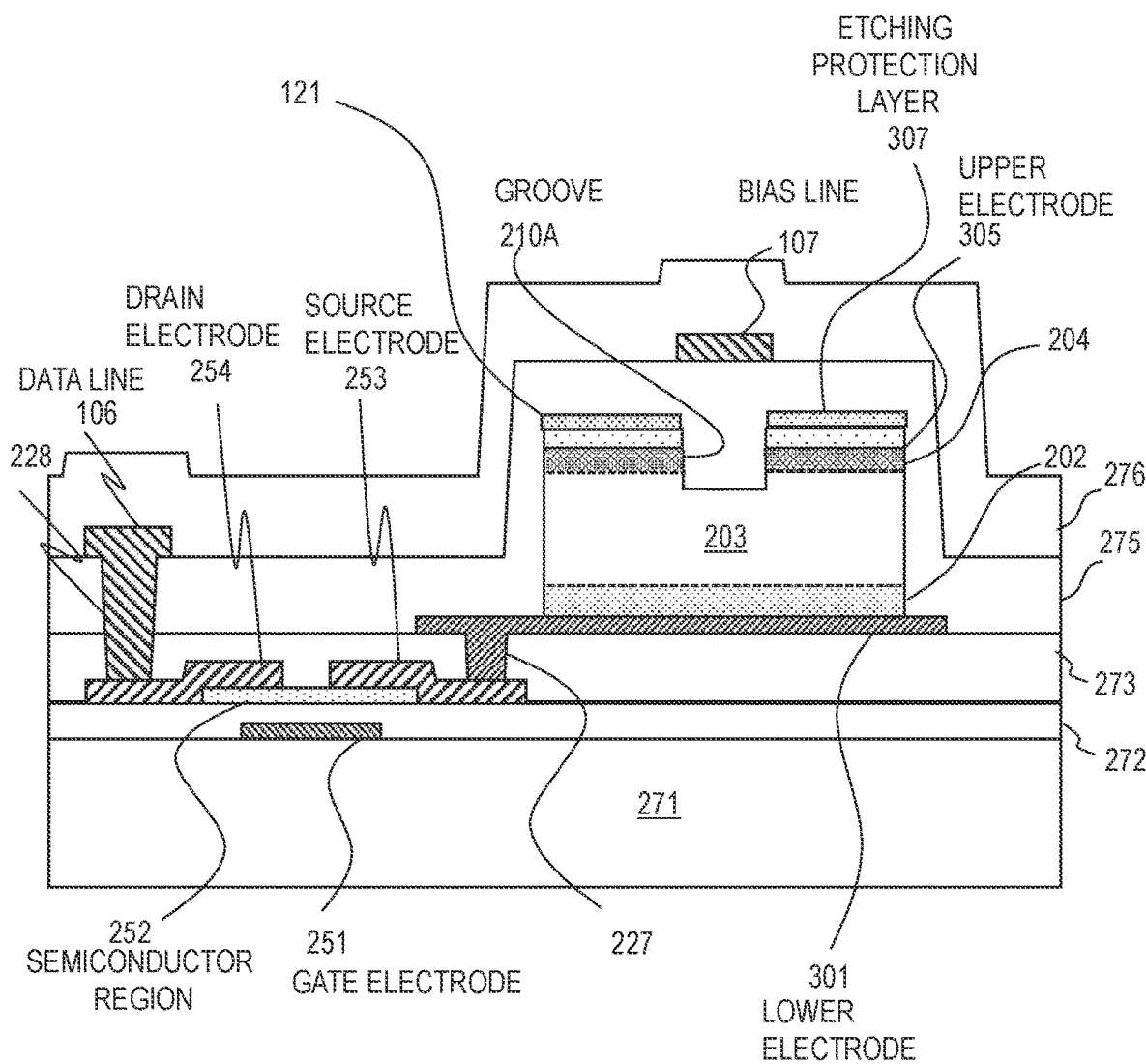
FIG. 7 is a cross-sectional diagram of a region including a pixel.

Still another example of the structure of the detection region 12 is described. FIG. 7 is a cross-sectional diagram of a region including a pixel 13 and corresponds to FIG. 3B. In the following, differences from the example of the structure in FIG. 3B are mainly described. This embodiment includes an etching protection layer 307 above the upper electrode 305. The etching protection layer 307 can have the same patterned shape as the upper electrode 305 and fully covers the upper electrode 305. In the example of FIG. 7, the etching protection layer 307 and the upper electrode 305 are identical in shape and size, namely congruent; however, they can be identical in shape but can be different in size (one can be larger than the other), namely similar. The etching protection layer 307 can be made of silicon nitride or silicon oxide.

This embodiment removes at least the upper electrode 305 and the uppermost amorphous silicon layer by etching to make a groove. An example of the method of etching amorphous silicon is dry-etching. To pattern the amorphous silicon layer by etching, the amorphous silicon layer is to be masked with a resist or the upper electrode 305 is used as a mask.

Etching the amorphous silicon damages the upper electrode 305. The quality and adhesiveness of the film including adhesiveness may change to cause detachment of the second interlayer insulating layer 275. This embodiment includes an etching protection layer 307 above the upper electrode 305, for example in direct contact with the upper electrode 305, to protect the upper electrode 305 from etching and uses these layers as masks in etching the amorphous silicon layer. This configuration reduces the etching damage of the upper electrode 305.

Figure 8:
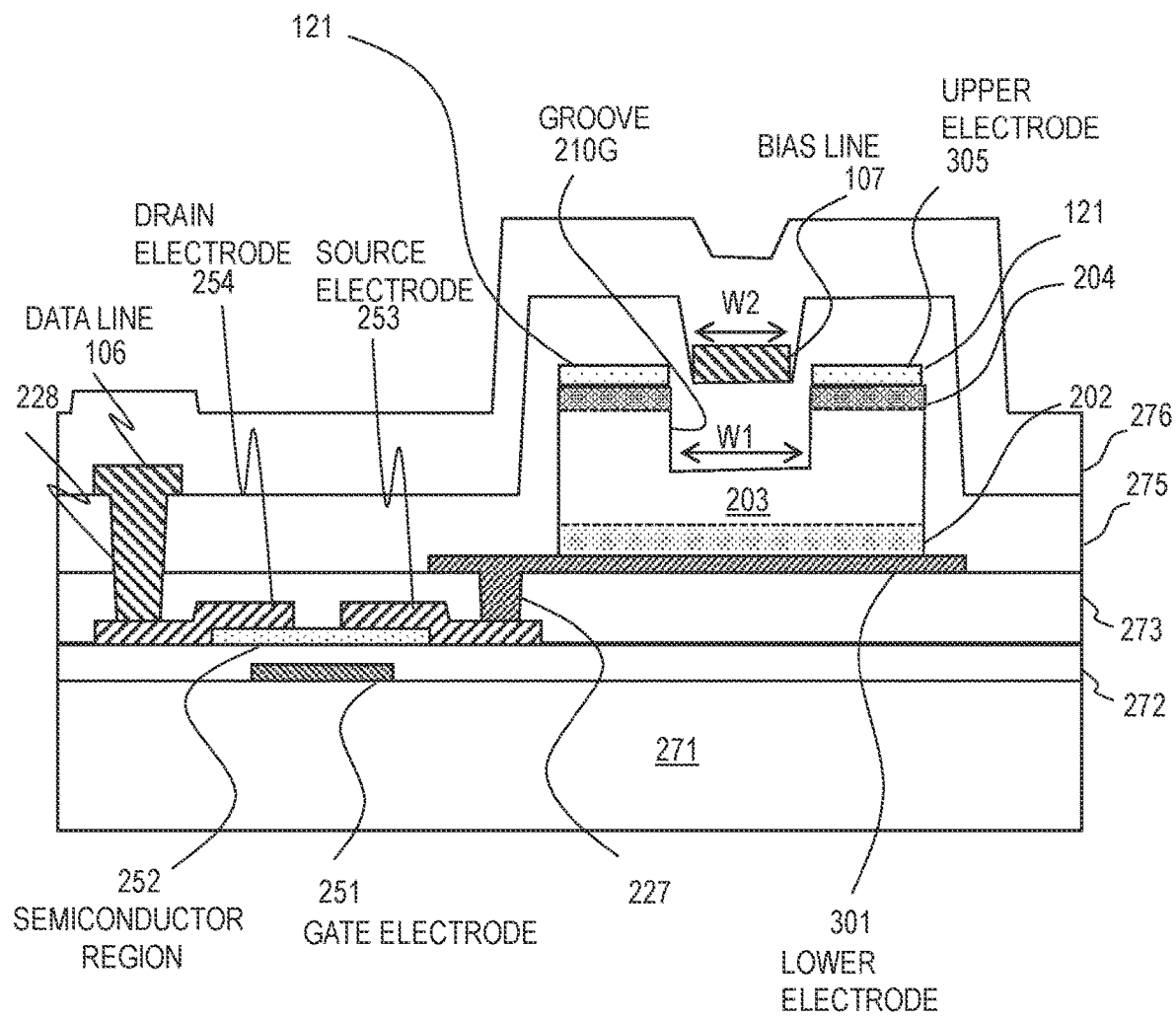
FIG. 8 is another cross-sectional diagram of a region including a pixel.

Still another example of the configuration of the detection region 12 is described. FIG. 8 is another cross-sectional diagram of a region including a pixel 13 and corresponds to FIG. 3B. In the following, differences from the example of the structure in FIG. 3B are mainly described. In the example of the structure in FIG. 8, the width W1 or the size in the widthwise direction of the groove 210G is larger than the width W2 of the bias line 107. Furthermore, the ends of the bias line 107 in the widthwise direction are located inner than the ends of the groove 210G of the photodiode semiconductor layers, when viewed planarly. The bias line 107 covers a part of the groove 210G in such a fashion that their ends defining the width of the bias line 107 are located in the groove 210G when viewed planarly.

If the groove 210G is narrower than the bias line 107 and the second interlayer insulating layer 275 is deposited to follow the shape of the groove, the bias line may follow the shape of the second interlayer insulating layer 275 to have a V-shaped cross-section. As a result, voids may be generated in a wide range. The voids may grow by migration to cause disconnection. Providing a groove 210G wider than the bias line 107 in such a layout that the groove 210G includes the upper bias line 107 when viewed planarly enables the bias line 107 to be formed nearly flat, reducing the voids.

Embodiment 4

Figure 9A:
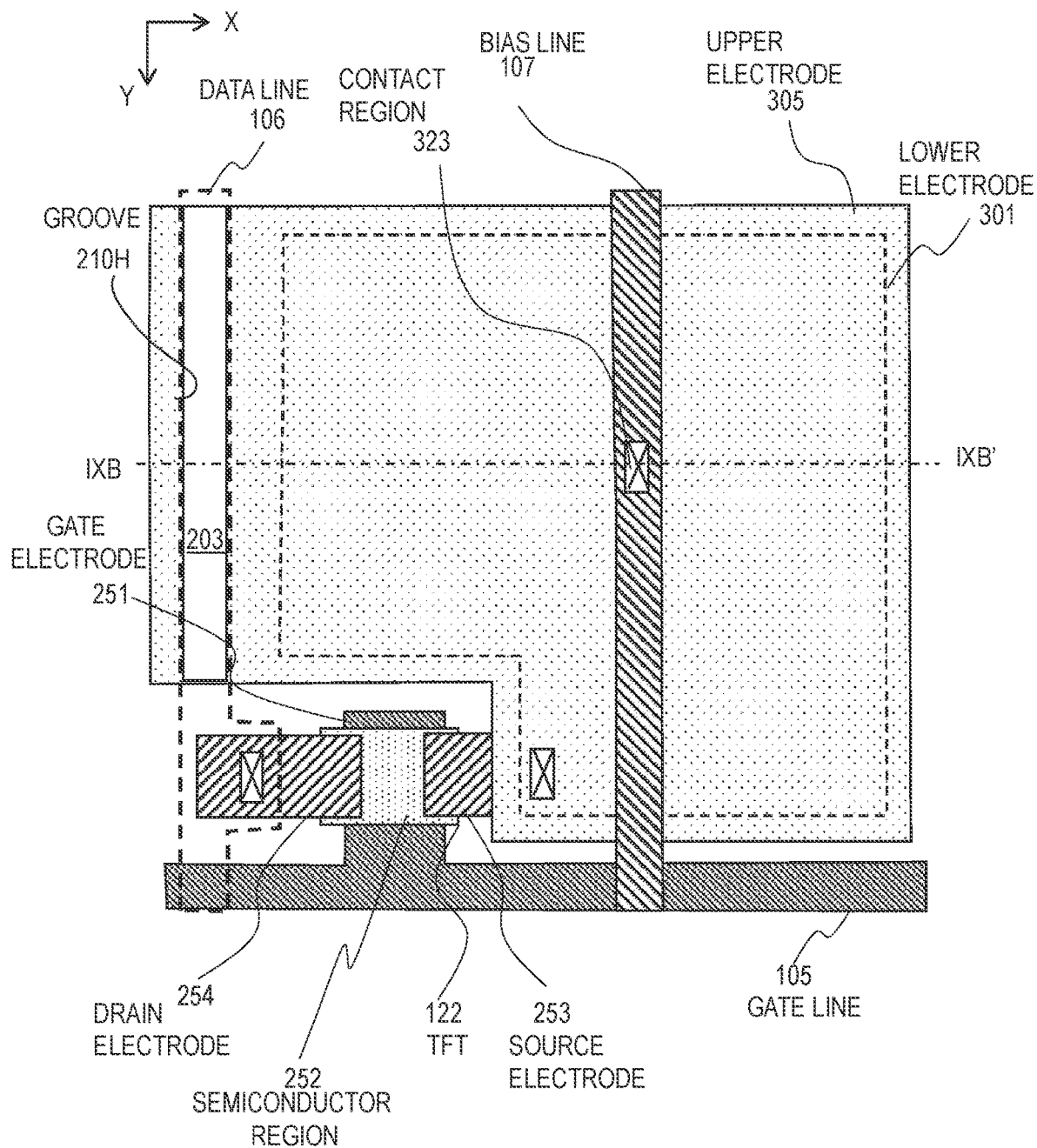
FIG. 9A is a plan diagram schematically illustrating still another example of the structure of a pixel inclusive of a gate line, a data line, and a bias line.
Figure 9B:
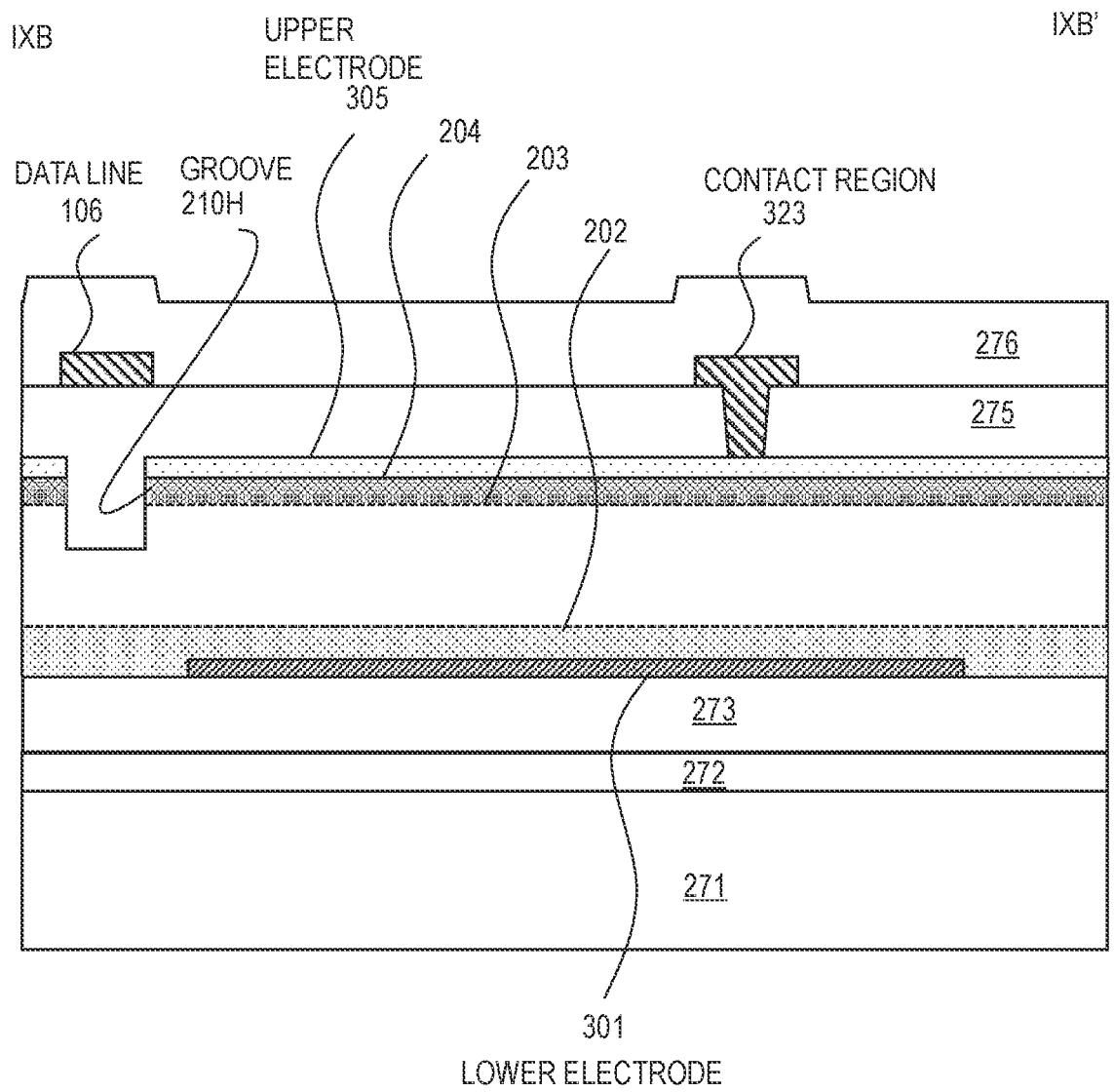
FIG. 9B is a cross-sectional diagram along the section line IXB-IXB' in FIG. 9A.

Still another example of the structure of the detection region 12 is described. FIG. 9A is a plan diagram schematically illustrating still another example of the structure of a pixel 13 inclusive of a gate line 105, a data line 106, and a bias line 107. FIG. 9A shows only the outline of the data line 106 by a thick dashed line and illustrates the structure under the data line 106 through the data line 106. The upper electrode 305 covers the entire lower electrode 301 and the outline of the lower electrode 301 is represented by a dashed line. The lower electrode 301 does not need to be completely covered with the upper electrode 305. FIG. 9B is a cross-sectional diagram along the section line IXB-IXB' in FIG. 9A. In the following, differences from the configuration described with reference to FIGS. 3A to 3D are mainly described.

The data line 106 is non-transmissive to the light to be converted by the photodiode 121 into electricity. The bias line 107 can be either transmissive or non-transmissive to the light. In the example of the structure illustrated in FIGS. 9A and 9B, a groove 210H is provided in the region covered with the data line 106 when viewed planarly. The intrinsic amorphous silicon layer 203 is exposed at the bottom of the groove 210H. The groove 210H is located outside of the lower electrode 301, when viewed planarly. The lower electrode 301 can overlap a part or the entirety of the groove 210H, when viewed planarly. The groove 210H is located outside the region covered with the upper electrode 305.

In this embodiment, an upper part of the photodiode semiconductor layers is removed in the region overlapping the data line 106 when viewed planarly. This structure reduces the kTC noise. Furthermore, this structure reduces the parasitic capacitance generated by the data line 106 with the upper electrode 305 or the upper impurity-doped amorphous silicon layer; the data line noise is also reduced.

The groove 210H reaches the ends of the photodiode semiconductor layers crossed by the data line 106. In other words, the ends in the Y-direction of the groove 210H coincide with the ends (side walls) of the photodiode semiconductor layers. For this reason, this structure has less risk of disconnection of the data line 106. In the example of the structure in FIGS. 9A and 9B, each of the inner side walls of the groove 210H opposed to each other in the widthwise direction (X-direction) is composed of a side face of the upper electrode 305, a side face of the p-type amorphous silicon layer 204, and an inner side wall of the groove of the intrinsic amorphous silicon layer 203 located one above another. However, one side of the groove 210H can be open as described in Embodiment 2.

As described with reference to FIGS. 9A and 9B, the region of the photodiode semiconductor layers to be provided with a groove can overlap a line different from the bias line, when viewed planarly. The photodiode semiconductor layers can have another groove under the bias line 107 as described in the foregoing other embodiments.

Embodiment 5

Figure 10A:
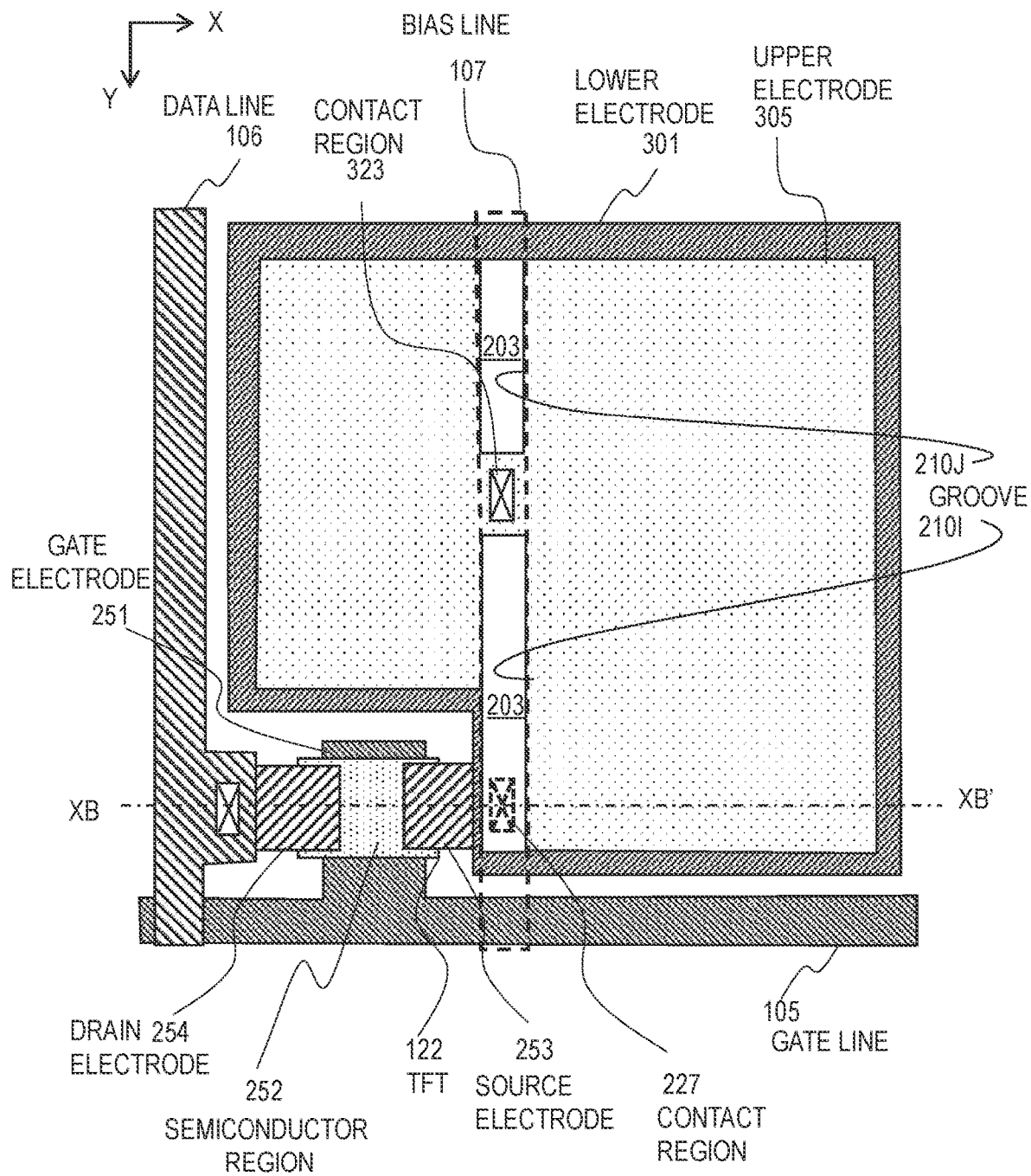
FIG. 10A is a plan diagram schematically illustrating still another example of the structure of a pixel inclusive of a gate line, a data line, and a bias line.
Figure 10B:
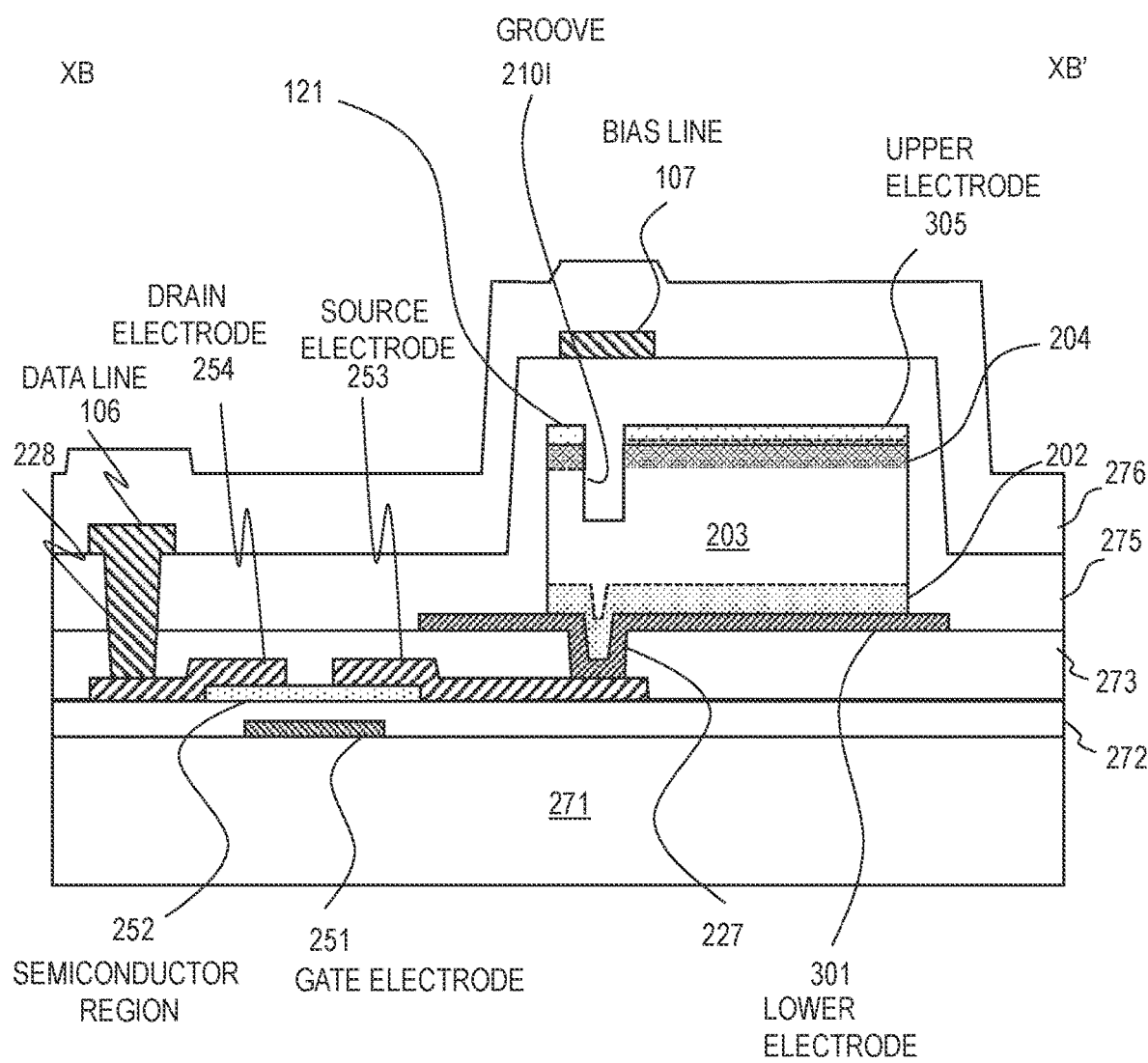
FIG. 10B is a cross-sectional diagram along the section line XB-XB' in FIG. 10A.

Still another example of the structure of the detection region 12 is described. FIG. 10A is a plan diagram schematically illustrating still another example of the structure of a pixel 13 inclusive of a gate line 105, a data line 106, and a bias line 107. FIG. 10A shows only the outline of the bias line 107 by a dashed line and illustrates the structure under the bias line 107 through the bias line 107. FIG. 10B is a cross-sectional diagram along the section line XB-XB' in FIG. 10A. In the following, differences from the configuration described with reference to FIGS. 3A to 3D are mainly described.

The photodiode semiconductor layers have grooves 210I and 210J in the region covered with the bias line 107 when viewed planarly. The intrinsic amorphous silicon layer 203 is exposed within the grooves 210I and 210J and the grooves 210I and 210J are located outside the region covered with the upper electrode 305.

When viewed planarly, the bottom of the groove 210I covers at least a part of the contact region 227 between the source electrode 253 and the lower electrode 301. Only a part of the contact region 227 including the center in a planar view can be covered with the groove 210I.

When the region under the amorphous silicon layers has a large height difference, the region of the amorphous silicon layers covering the height difference degrades in quality to generate defect levels more frequently than a flat region. When the contact region 227 between the source electrode 253 of the thin-film transistor 122 and the lower electrode 301 is located under the amorphous silicon layers, the contact region 227 may provide a height difference to the amorphous silicon layers. The height difference impairs the dark current characteristics of the photodiode 121 located thereabove. The increase in dark current can be prevented by eliminating the vertical electric field between the upper and the lower impurity-doped amorphous silicon layers, which is achieved by removing an impurity-doped amorphous silicon layer in the region above the height difference where the characteristics are likely to be impaired.

Embodiment 6

Figure 11A:
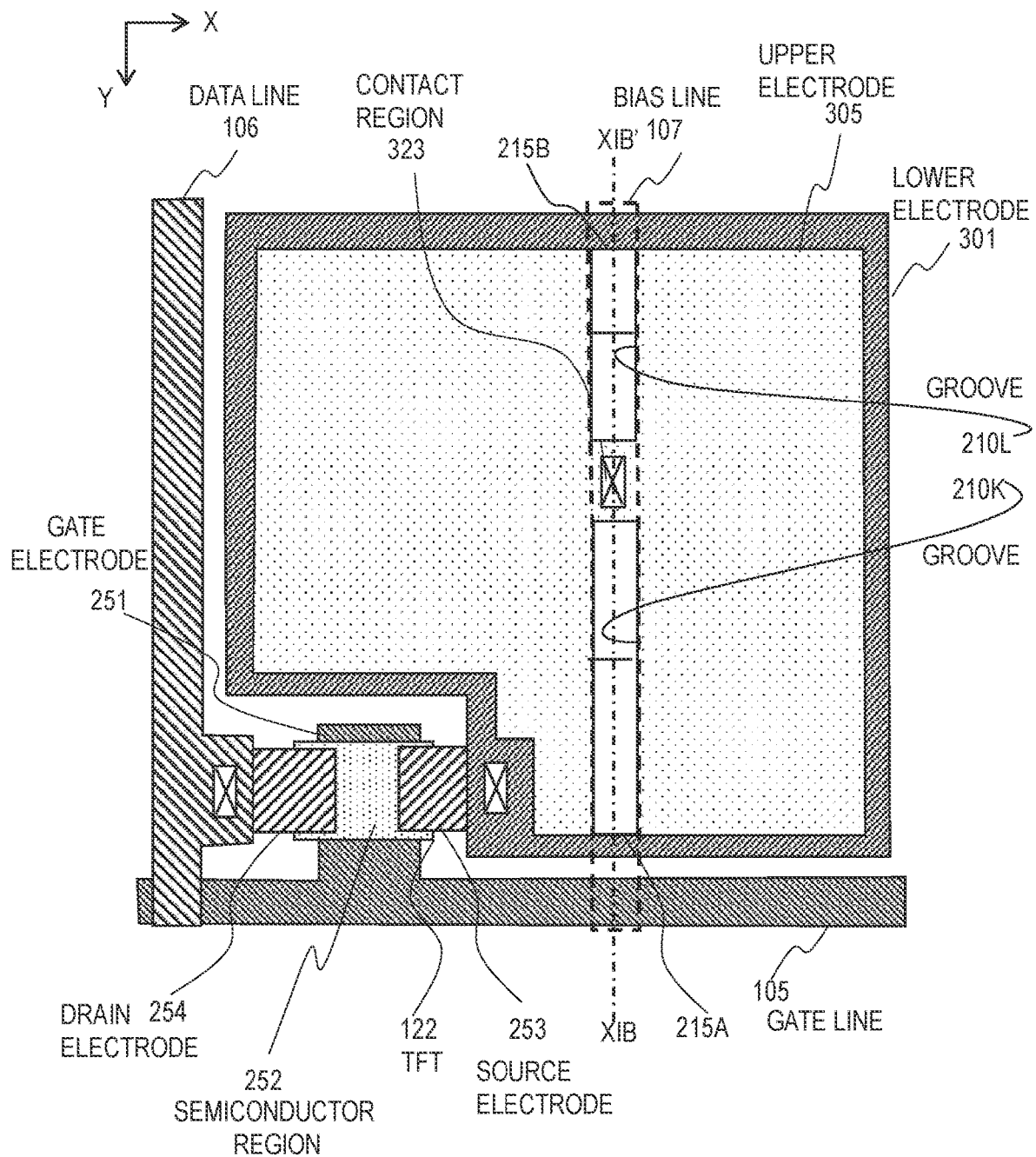
FIG. 11A is a plan diagram schematically illustrating still another example of the structure of a pixel inclusive of a gate line, a data line, and a bias line.
Figure 11B:
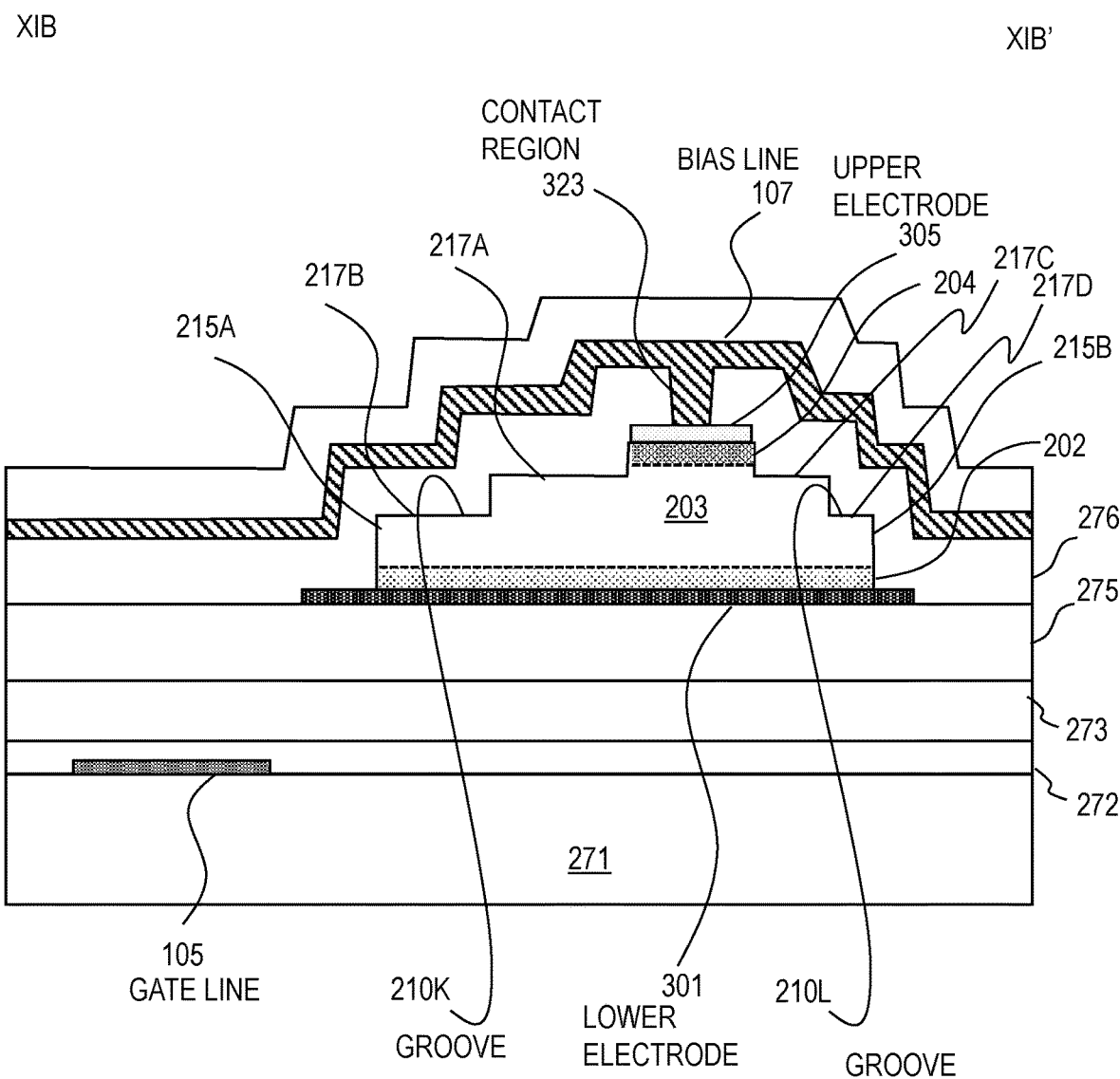
FIG. 11B is a cross-sectional diagram along the section line XIB-XIB' in FIG. 11A.

Still another example of the structure of the detection region 12 is described. FIG. 11A is a plan diagram schematically illustrating still another example of the structure of a pixel 13 inclusive of a gate line 105, a data line 106, and a bias line 107. FIG. 11A shows only the outline of the bias line 107 by a dashed line and illustrates the structure under the bias line 107 through the bias line 107. FIG. 11B is a cross-sectional diagram along the section line XIB-XIB' in FIG. 11A. In the following, differences from the configuration described with reference to FIGS. 3A to 3D are mainly described.

In place of the grooves 210A and 210B in FIGS. 3A to 3D, grooves 210K and 210L are provided. The bottom of the groove 210K is lowered stepwise toward the end 215A of the photodiode semiconductor layers. The bottom of the groove 210L is lowered stepwise toward the end 215B of the photodiode semiconductor layers.

In the example illustrated in FIG. 11B, the bottom of the groove 210K is composed of two planes 217A and 217B different in height. The height of the plane 217B from the lower electrode 301 is lower than the height of the plane 217A from the lower electrode 301. The plane 217A is located between the contact region 323 and the plane 217B. The plane 217B reaches the end 215A of the photodiode semiconductor layers (the n-type amorphous silicon layer 202 and the intrinsic amorphous silicon layer 203).

The bottom of the groove 210L is composed of two planes 217C and 217D different in height. The height of the plane 217D from the lower electrode 301 is lower than the height of the plane 217C from the lower electrode 301. The plane 217C is located between the contact region 323 and the plane 217D. The plane 217D reaches the end 215B of the photodiode semiconductor layers (the n-type amorphous silicon layer 202 and the intrinsic amorphous silicon layer 203).

Such a structure that the bottom of a groove is composed of a plurality of steps and its height decreases toward the end reduces the possibility of disconnection of the bias line 107 provided thereabove. The number of steps of the bottom can be three or more. The bottom of the groove 210C, 210D, 210E, or 210F in the configuration example illustrated in FIGS. 5A and 5B or FIG. 6 can be lowered stepwise toward the end of the photodiode semiconductor layers.

Embodiment 7

Figure 12:
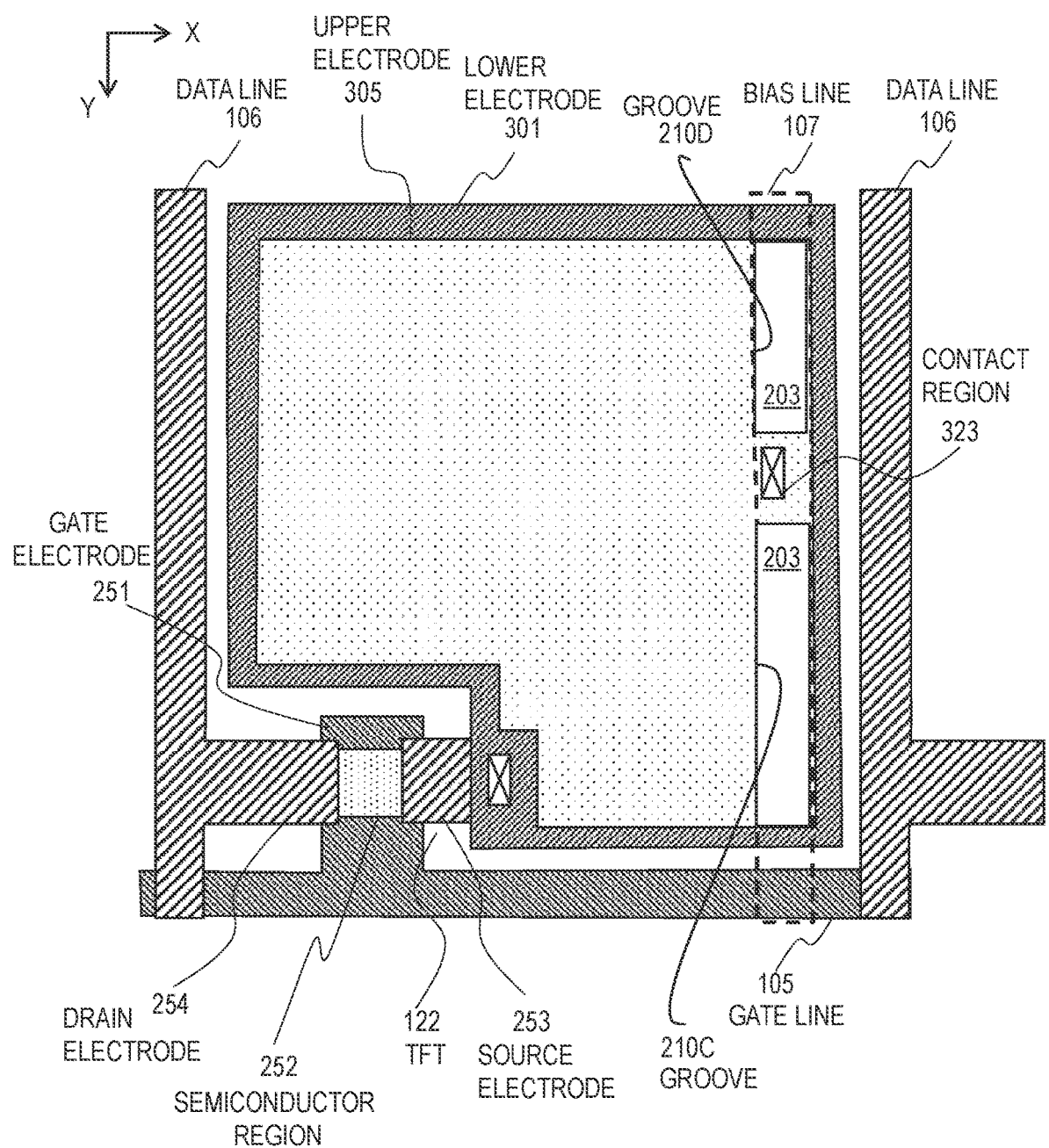
FIG. 12 is a plan diagram schematically illustrating still another example of the structure of a pixel inclusive of a gate line, a data line, and a bias line.

Still another example of the structure of the detection region 12 is described. FIG. 12 is a plan diagram schematically illustrating still another example of the structure of a pixel 13 inclusive of a gate line 105, a data line 106, and a bias line 107. In the following, differences from the configuration described with reference to FIG. 5A are mainly described.

In the configuration example described with reference to FIG. 5A, the data line 106 and the bias line 107 are included in the same layer. In this embodiment, the data line 106 is included in a lower layer than the bias line 107. In an example, the data line 106 is included in the same layer as the source electrode 253 and the drain electrode 254 of the thin-film transistor 122.

In the case where the bias line 107 is disposed along an end of the photodiode semiconductor layers, the bias line 107 is located close to the data line 106 for the adjacent pixel and therefore, noise is likely to be generated. Disposing the data line 106 on the same layer as the source electrode 253 and the drain electrode 254 increases the distance between the data line 106 and the bias line 107 to reduce the noise of the data line.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. An imaging device comprising:
a substrate;
photodiode semiconductor layers on the substrate;
an upper electrode and a lower electrode sandwiching the photodiode semiconductor layers; and
a non-light-transmissive line included in a layer upper than the upper electrode, defining the substrate as the lowermost layer,
wherein the photodiode semiconductor layers include:
a first semiconductor layer; and
a second semiconductor layer located between the first semiconductor layer and the lower electrode,
wherein the photodiode semiconductor layers have a groove in which the first semiconductor layer is removed in a region covered with the non-light-transmissive line in a planar view,
wherein a region overlapping the groove in the planar view does not include the upper electrode, and
wherein the region overlapping the groove in the planar view includes a part of the second semiconductor layer and a part of the lower electrode.

2. The imaging device according to claim 1,
wherein the photodiode semiconductor layers include a third semiconductor layer between the first semiconductor layer and the second semiconductor layer, and
wherein a part of the third semiconductor layer works as a bottom of the groove.

3. The imaging device according to claim 2, wherein the third semiconductor layer has a groove working as a part of the groove.

4. The imaging device according to claim 1, wherein the non-light-transmissive line is a bias line to supply a bias potential to the photodiode semiconductor layers via the upper electrode.

5. The imaging device according to claim 1,
wherein, in the planar view, the non-light-transmissive line crosses an end of the second semiconductor layer, and
wherein, in the planar view, an end of the groove coincides with the end of the second semiconductor layer.

6. The imaging device according to claim 5, wherein a bottom of the groove is lowered stepwise toward the end of the second semiconductor layer.

7. The imaging device according to claim 1,
wherein the non-light-transmissive line extends along an end of the second semiconductor layer and covers the end,
wherein the groove extends along the end, and
wherein, in the planar view, an end of the groove coincides with the end of the second semiconductor layer.

8. The imaging device according to claim 1, further comprising:
an insulating layer covering the upper electrode, the insulating layer having a patterned shape similar or congruent to the upper electrode.

9. The imaging device according to claim 1,
wherein the non-light-transmissive line has a narrower width than the groove, and
wherein the non-light-transmissive line covers a part of the groove in such a fashion that ends defining the width of the non-light-transmissive line are located within the groove in the planar view.

10. The imaging device according to claim 1, wherein the non-light-transmissive line is a data line to transmit a signal from the photodiode semiconductor layers.

11. The imaging device according to claim 1, further comprising:
a transistor connected to the lower electrode,
wherein, in the planar view, a bottom of the groove covers at least a part of a contact region between the transistor and the lower electrode.

12. The imaging device according to claim 1, further comprising:
a data line to transmit a signal from the photodiode semiconductor layers,
wherein the non-light-transmissive line is a bias line to supply a bias potential to the photodiode semiconductor layers via the upper electrode,
wherein the data line extends in parallel to the bias line, and
wherein the data line is included in a layer lower than the bias line.

* * * * *